(12) United States Patent
Miura et al.

(10) Patent No.: US 11,898,009 B2
(45) Date of Patent: Feb. 13, 2024

(54) POLYIMIDE, LAMINATE, AND ELECTRONIC DEVICE INCLUDING SAME

(71) Applicant: UBE INDUSTRIES, LTD., Ube (JP)

(72) Inventors: Norio Miura, Ube (JP); Kazutaka Narita, Ube (JP)

(73) Assignee: Ube Corporation, Ube (JP)

( * ) Notice: Subject to any disclaimer, the term of this patent is extended or adjusted under 35 U.S.C. 154(b) by 599 days.

(21) Appl. No.: 17/048,431

(22) PCT Filed: Apr. 19, 2019

(86) PCT No.: PCT/JP2019/016858
§ 371 (c)(1),
(2) Date: Oct. 16, 2020

(87) PCT Pub. No.: WO2019/203353
PCT Pub. Date: Oct. 24, 2019

(65) Prior Publication Data
US 2021/0171714 A1     Jun. 10, 2021

(30) Foreign Application Priority Data

Apr. 20, 2018   (JP) ................. 2018-081765

(51) Int. Cl.
*C08G 73/10*     (2006.01)
*C08G 73/12*     (2006.01)
(Continued)

(52) U.S. Cl.
CPC ....... *C08G 73/1067* (2013.01); *C08G 73/126* (2013.01); *C09D 179/085* (2013.01);
(Continued)

(58) Field of Classification Search
CPC .............. C08G 73/1067; C08G 73/126; C09D 179/085; H01L 27/1218; H01L 27/1266; H10K 77/111; G02F 1/13305
(Continued)

(56) References Cited

U.S. PATENT DOCUMENTS

2007/0260035 A1   11/2007  Watanabe
2013/0211040 A1    8/2013  Nakao et al.
(Continued)

FOREIGN PATENT DOCUMENTS

CN          1954015 A     4/2007
CN        104769021 A     7/2015
(Continued)

OTHER PUBLICATIONS

Junehwan Kim et al. "High Performance Reliability LTPS Technology for Advanced Flexible Mobile Applications", IWD/AD' 16, pp. 1356-1359 (2016).
(Continued)

*Primary Examiner* — Ling Siu Choi
*Assistant Examiner* — Ronald Grinsted
(74) *Attorney, Agent, or Firm* — Knobbe, Martens, Olson & Bear, LLP

(57) ABSTRACT

A flexible electronic device containing a polyimide film exhibiting excellent C-V characteristics. The polyimide film is a film that shows a maximum gradient of 0.005/V or more in a capacitance-voltage measurement of a laminate in which a polyimide film having a film thickness of 0.75 μm is formed on a silicon wafer having a resistance value of 4 Ωcm; the maximum gradient meaning a maximum value of an absolute value of a gradient in a normalized capacity-voltage curve during a third scan of forward direction scans; a capacity-voltage curve being measured by applying a direct current voltage is to the polyimide film with respect to
(Continued)

the silicon wafer between a lowest voltage V1 and a highest voltage V2, and measuring capacitance while the direct current voltage is scanned in a forward direction and scanned in a negative direction; the normalized capacity-voltage curve being normalized so that the capacity at the lowest voltage V1 is 1.

11 Claims, 1 Drawing Sheet

(51) Int. Cl.
  *C09D 179/08* (2006.01)
  *H01L 27/12* (2006.01)
  *G02F 1/1333* (2006.01)
  *H10K 77/10* (2023.01)
(52) U.S. Cl.
  CPC .... *H01L 27/1218* (2013.01); *G02F 1/133305* (2013.01); *H01L 27/1266* (2013.01); *H10K 77/111* (2023.02)
(58) Field of Classification Search
  USPC .......................................................... 524/879
  See application file for complete search history.

(56) References Cited

U.S. PATENT DOCUMENTS

| | | | |
|---|---|---|---|
| 2016/0168328 | A1 | 6/2016 | Takiue |
| 2019/0048143 | A1 | 2/2019 | Hong et al. |

FOREIGN PATENT DOCUMENTS

| | | | | | |
|---|---|---|---|---|---|
| JP | H04-224824 | A | | 8/1992 | |
| JP | H11-199864 | | | 7/1999 | |
| JP | 2007-137933 | A | | 6/2007 | |
| JP | 2007137933 | A | * | 6/2007 | |
| JP | 2008-230096 | A | | 10/2008 | |
| JP | 2011-222780 | A | | 11/2011 | |
| JP | 2012-077285 | A | | 4/2012 | |
| JP | 2013-209498 | A | | 10/2013 | |
| JP | 2015-021022 | A | | 2/2015 | |
| JP | 2015-214122 | A | | 12/2015 | |
| JP | 2015214122 | A | * | 12/2015 | |
| JP | 2016-225638 | A | | 12/2016 | |
| JP | 2016225638 | A | * | 12/2016 | ........... B32B 17/064 |
| JP | 2007-137933 | | | 6/2017 | |
| JP | 2019-502786 | A | | 1/2019 | |
| TW | 201431955 | | | 8/2014 | |
| WO | WO 2005/113645 | A1 | | 12/2005 | |
| WO | WO-2005113645 | A1 | * | 12/2005 | ............ B32B 15/08 |
| WO | WO 2014/098042 | A1 | | 6/2014 | |
| WO | WO 2015/045414 | A1 | | 4/2015 | |
| WO | WO-2015045414 | A1 | * | 4/2015 | ............... G03F 1/24 |
| WO | WO 2016/136597 | | | 9/2016 | |
| WO | WO 2017/176000 | A1 | | 10/2017 | |

OTHER PUBLICATIONS

Yi-Da Ho et al. "Abnormal Vth Degradation Behavior of the Polycrystalline Silicon Thin-Film Transistors on the Polyimide Substrate" IDW' 17, pp. 1508-1511 (2017).
Office Action in Taiwanese Patent Application No. 10821206300 dated Dec. 18, 2019.
International Preliminary Report on Patentability in International Application No. PCT/JP2019/016858 dated Oct. 29, 2020.
Office Action issued in Chinese Patent Application No. 201980040361.X, dated Oct. 17, 2022.
Office Action in Japanese Patent Application No. 2018-081765, dated Feb. 5, 2019.
Office Action in Japanese Patent Application No. 2019-106461, dated Jan. 7, 2020.
Office Action in Japanese Patent Application No. 2019-106461, dated Jun. 16, 2020.
Final Office Action in Japanese Patent Application No. 2019-106461, dated Oct. 20, 2020.
Japanese Publications Submission in Japanese Application No. 2019-106461, dated Oct. 19, 2020.
Decision of Rejection in Taiwanese Patent Application No. 108113900.
Office Action in Taiwanese Patent Application No. 108113900.

* cited by examiner

POLYIMIDE, LAMINATE, AND ELECTRONIC DEVICE INCLUDING SAME

TECHNICAL FIELD

The present invention relates to a polyimide advantageously used for electronic device applications such as a substrate for a flexible device, and further relates to a polyimide film, a laminate including the polyimide film, and an electronic device including the polyimide or the laminate.

Conventionally, glass has been used as a substrate for a display such as a liquid crystal display or an organic EL display. However, there is a problem that glass is fragile due to insufficient strength when it is made thin to reduce its weight. Therefore, as an alternative to the glass substrate, a lightweight and flexible plastic substrate has been proposed. In displays such as liquid crystal displays and organic EL displays, semiconductor elements such as TFTs are formed on a substrate in order to drive each pixel. Therefore, the substrate is required to have heat resistance and dimensional stability. A polyimide film is expected as a substrate for a display because it has excellent heat resistance, chemical resistance, mechanical strength, electrical characteristics, dimensional stability, and the like.

Regarding TFT elements formed on a polyimide substrate, Non-Patent Documents 1 and 2 report that positive charges are induced by negative charges existing at the interface of the polyimide substrate, and this affects TFT characteristics.

CITATION LIST

Non-Patent Document

Non-Patent Document 1: Junehwan Kim et al., "High Performance Reliebility LTPS Technology for Advanced Flexible Mobile Applications", IDW/AD '16, pp. 1356-1359 (2016)

Non-Patent Document 2: Yi-Da Ho et al., "Abnormal $V_{th}$ Degradation Behavior of the Polycrystalline Silicon Thin-Film Transistors on the Polyimide Substrate", IDW '17, pp. 1508-1511 (2017)

SUMMARY OF THE INVENTION

Technical Problem

As described above, Non-Patent Documents 1 and 2 report the influence of the interface of polyimide on the TFT characteristics, but the interfacial level density, at which a negative charge may exist, is not specifically evaluated. Further, there is no description about the details of the polyimide and there is no data about TFT characteristics that are evaluated by changing the polyimide substrate, and therefore, no information has been known about polyimides suitable as a substrate.

As a method of evaluating the level density of the surface of an insulating film such as polyimide, there is a method of measuring a capacitance-voltage characteristic (hereinafter, referred to as C-V characteristic). It is known that, generally, the C-V curve obtained by evaluating the voltage dependence of the capacitance of the semiconductor-insulating film-metal (electrode) capacitor may change its shape due to the presence of the level density existing at the semiconductor-insulating film interface. Therefore, it is necessary to provide a polyimide having excellent C-V characteristics by evaluating the C-V characteristics that affect the device characteristics such as TFT characteristics, in order to develop an optimal polyimide film as a substrate for semiconductor devices including displays and electronic devices, and in order to further expand applications of polyimide.

An object of the present invention is to provide a polyimide exhibiting excellent C-V characteristics, particularly a polyimide in a form of a film, a laminate substrate using the polyimide, and an electronic device such as a flexible display including these.

Solution to Problem

The present invention relates to the following items.
1. A polyimide film for flexible electronic devices formed of a polyimide showing a maximum gradient of 0.005/V or more in a capacitance-voltage measurement of a laminate in which a polyimide film was formed with a film thickness of 0.75 μm on a silicon wafer having a resistance value of 4 Ωcm; wherein the maximum gradient means a maximum value of an absolute value of a gradient in a normalized capacity-voltage curve during a third scan of forward direction scans; wherein a capacity-voltage curve is measured by applying a direct current voltage is to the polyimide film with respect to the silicon wafer between a lowest voltage V1 and a highest voltage V2, and measuring capacitance while the direct current voltage is scanned in a forward direction from the lowest voltage V1 to the highest voltage V2 and scanned in a negative direction from the highest voltage V2 to the lowest voltage V1: where the lowest voltage V1 is a voltage at which the capacity of only the polyimide film is observed, and the normalized capacity-voltage curve is normalized so that the capacity at the lowest voltage V1 is 1.
2. The polyimide film for a flexible electronic device according to the above item 1, wherein the weight ratio of imide group (—CONCO—) in a repeating unit of the polyimide is less than 38.3 wt %.
3. The polyimide film for a flexible electronic device according to the above item 1 or 2, wherein the concentration of amine end groups calculated from a feed ratio in the entire polyimide is 29 μmol/g or less.
4. A polyimide precursor comprising a repeating unit which is obtainable by reacting:
a tetracarboxylic acid component (A) comprising at least 3,3' 4,4'-biphenyltetracarboxylic dianhydride, and
a diamine component (B) comprising:
(B-1) at least one diamine selected from 1,4-diaminobenzene, [1,1': 4',1"-terphenyl]-4,4"-diamine, and 1,4-bis [2-(4-aminophenyl)-2-propyl]benzene, and
(B-2) at least one diamine selected from 9,9-bis (4-aminophenyl) fluorene, 4,4'-(((9H-fluorene-9,9-diyl)bis ([1,1'-biphenyl]-5,2-diyl))bis(oxy))diamine, and 4,4'-([1,1'-binaphthalene]-2,2'-diylbis(oxy))diamine
with the proviso that when the diamine component (B) comprises 1,4-diaminobenzene and 9,9-bis(4-aminophenyl)fluorene), the amount of diamine compound(s) other than the diamine of (B-1) and the diamine (B-2) is 20 mol % or less.
5. The polyimide precursor according to the above item 4, wherein the diamine component (B) comprises the diamine of (B-1) and the diamine of (B-2) in an amount of 40 mol % or more in total.
6. The polyimide precursor according to the above item 4, wherein a sum of ratios of the repeating units derived from 3,3', 4,4' biphenyltetracarboxylic dianhydride and the diamine (B-1) and the repeating units derived from 3,3', 4,4'-biphenyltetracarboxylic dianhydride and the diamine (B-2) is 40 mol % or more.
7. A polyimide obtained by imidizing the polyimide precursor according to any one of the above items 4 to 6.
8. A polyimide film which is the polyimide according to the above item 7 in a form of a film.
9. A flexible electronic device comprising the polyimide film according to any one of the above items 1 to 3.
10. The flexible electronic device according to the above item 9, wherein the polyimide film is the polyimide film according to the above item 8.
11. A method for manufacturing a flexible electronic device according to the above item 9 or 10, comprising: applying polyimide precursor solution or a polyimide precursor solution composition onto a carrier substrate, and performing imidization to form a laminate having the carrier substrate and a polyimide film.

In addition to the above, the present application also discloses at least the following items.

1. A polyimide showing a maximum gradient of 0.005/V or more in a capacitance-voltage measurement of a laminate in which a polyimide film was formed with a film thickness of 0.75 μm on a silicon wafer having a resistance value of 4 Ωcm; wherein the maximum gradient means a maximum value of an absolute value of a gradient in a normalized capacity-voltage curve during a third scan of forward direction scans; wherein a capacity-voltage curve is measured by applying a direct current voltage is to the polyimide film with respect to the silicon wafer between a lowest voltage V1 and a highest voltage V2, and measuring capacitance while the direct current voltage is scanned in a forward direction from the lowest voltage V1 to the highest voltage V2 and scanned in a negative direction from the highest voltage V2 to the lowest voltage V1; where the lowest voltage V1 is a voltage at which the capacity of only the polyimide film is observed, and the normalized capacity-voltage curve is normalized so that the capacity at the lowest voltage V1 is 1.
2. The polyimide according to the above item 1, wherein the weight ratio of the imide group (—CONCO—) in a repeating unit of the polyimide is less than 38.3 wt %.
3. The polyimide according to the above item 1 or 2, wherein the concentration of amine end groups calculated from a feed ratio in the entire polyimide is 29 μmol/g or less.
4. A polyimide precursor comprising a repeating unit which is obtainable by reacting:
a tetracarboxylic acid component (A) comprising at least 3,3' 4,4'-biphenyltetracarboxylic dianhydride, and
a diamine component (B) comprising:
(B-1) at least one diamine selected from 1,4-diaminobenzene, [1,1': 4',1"-terphenyl]-4,4"-diamine, and 1,4-bis[2-(4-aminophenyl)-2-propyl]benzene, and
(B-2) at least one diamine selected from 9,9-bis (4-aminophenyl) fluorene, 4,4'-(((9H-fluorene-9,9-diyl)bis([1,1'-biphenyl]-5,2-diyl))bis(oxy))diamine, and 4,4'-([1,1'-binaphthalene]-2,2'-diylbis(oxy))diamine.
5. The polyimide precursor according to item 4, wherein the diamine component (B) contains the diamine of (B-1) and the diamine of (B-2) in a proportion of 40 mol % or more.
6. The polyimide precursor according to the above item 4, wherein a sum of ratios of the repeating units derived from 3,3', 4,4'-biphenyltetracarboxylic dianhydride and the diamine (B-1) and the repeating units derived from 3,3', 4,4'-biphenyltetracarboxylic dianhydride and the diamine (B-2) is 40 mol % or more.
7. A polyimide obtained by imidizing the polyimide precursor according to any one of the above items 4 to 6.
8. A polyimide precursor solution that gives the polyimide according to any one of the above items 1 to 3.
9. A polyimide solution that gives the polyimide according to any one of the above items 1 to 3.
10. A method for producing a polyimide solution, which comprises imidizing the polyimide precursor solution according to the above item 8.
11. A polyimide film which is the polyimide according to anyone of items 1 to 3 and 7 in a form of a film.
12. A laminate having a substrate and the polyimide film according to the above item 11.
13. A substrate comprising the polyimide film according to the above item 11 for a use in an electronic device application.
14. An electronic device comprising the polyimide film of the above item 11, the laminate of the above item 12 or the substrate of the above item 13.
15. An electronic device comprising a semiconductor layer formed on the polyimide film of the above item 11, the laminate of the above item 12 or the substrate of the above item 13.

Effect of the Invention

According to the present invention, provided is a polyimide exhibiting excellent C-V characteristics, particularly a polyimide in a form of a film, a laminate substrate using the polyimide, and an electronic device, especially a flexible electronic device, such as a flexible display including these.

Since the polyimide film of the present invention has excellent C-V characteristics, when it is used as, for example, a substrate of a semiconductor element such as a TFT, there is little concern that the performance of the semiconductor element is affected, and especially there is little concern about changes or deteriorations in element characteristics such as a shift of switching characteristics during a long-term use.

DESCRIPTION OF EMBODIMENTS

<<C-V Characteristics>>

Figure 1:
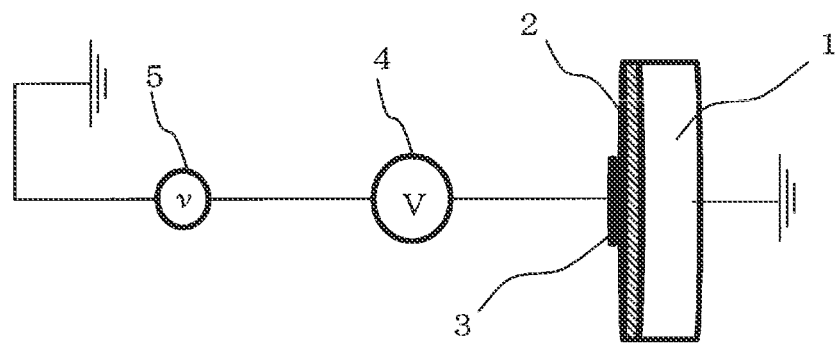
FIG. 1 is a schematic diagram of a system for measuring the C-V characteristic of a polyimide.

First, the measurement method and definition of C-V characteristics related to polyimide will be described. FIG. 1 shows a schematic diagram of a C-V measurement system. A polyimide film 2 is formed on the surface of a silicon wafer 1 and used as a measurement sample. The mercury electrode 3 is formed by contacting mercury with a predetermined area of the surface of the polyimide film 2. A direct current voltage is applied between the silicon wafer 1 (ground potential) and the mercury electrode 3 by the direct current power source 4, and a capacitance at the direct current voltage is measured by applying an alternating current voltage having a predetermined frequency and amplitude by the use of an alternating current power source 5. In the present application, forward direction scan (increase in the direct current voltage) and negative direction scan (decreases in the direct current voltage) are performed between the lowest voltage V1 and the highest voltage V2 of the direct current voltage, during which the capacitance is measured. A "maximum gradient", which will be described later, is obtained based on the data of the C-V measurement during the third scan of forward direction scans.

As the lowest voltage V1 in the direct current voltage range, when the silicon wafer is p-type, a sufficient negative bias voltage is applied so that the capacity of only the polyimide film is observed. Although the voltage is set to −40V in the embodiment of the present invention, a lower voltage (voltage having a large negative absolute value) may be required depending on the properties of the polyimide film. The highest voltage V2 in the direct current voltage range is sufficiently higher than the voltage at which the maximum gradient described later is observed, and is also sufficiently high so that the maximum gradient is observed even in the scanning in the negative direction. Further, both the absolute value of the lowest voltage V1 and the highest voltage V2 are widely set within the range that is equal to or lower than the dielectric breakdown voltage of the polyimide film and within the allowance of the device capacity. In the embodiment of the present invention, the scanning range is −40V to 40V.

The scanning speed of the direct current voltage is, for example, in the range of 10 mV/sec to 100 V/sec, and may be selected in consideration of the purpose of measurement from this range. In a practical view, the scanning speed is selected from the range of 0.05 V/sec to 2 V/sec. for example, the range of 0.1 V/sec to 0.5 V/sec for achieving good reproducibility. In the embodiment of the present invention, 0.25 V/sec and 0.18 V/sec were adopted. As will be described later, it has been confirmed that there is no difference due to the difference between these two scanning speeds.

The AC voltage (sine wave) for measuring the capacitance can be changed depending on the application of the polyimide film (that is, in accordance with the frequency range of interest). For display application, it may be measured at a frequency within the range, for example, 100 Hz to 1 MHz, particularly 500 Hz to 10 kHz. In the embodiment of the present invention, 2.5 kHz was used. Further, the amplitude may be appropriately selected as long as it is a voltage sufficiently smaller than the direct current voltage. In the embodiment of the present invention, 0.1V was selected.

In the present invention, when evaluating the C-V measurement result, the nature of a polyimide is evaluated by using a normalized capacity-voltage curve (normalized C-V curve) in which the measured C-V curve is normalized by taking the capacity value at the lowest voltage V1 as being 1. This is performed so as to evaluate factors that affect the semiconductor, such as interfacial level while eliminating differences in capacitance value due to errors in the thickness of the polyimide film and differences in dielectric constant. Regarding the film thickness of the polyimide film to be measured, in the evaluation of the present application, it is preferable to set a targeted thickness in a rage of 0.65 μm to 0.85 μm, particularly 0.75 μm in order to minimize the evaluation error.

Figure 2:
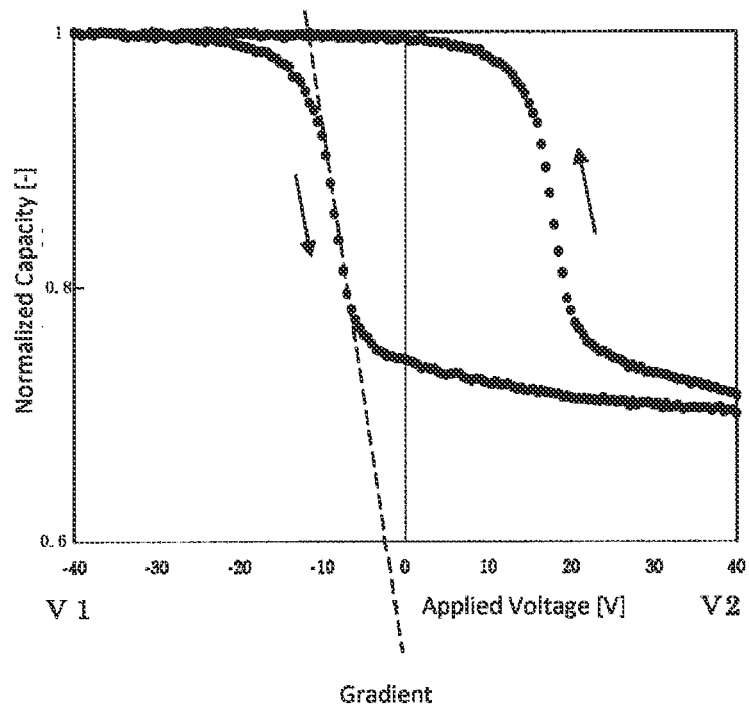
FIG. 2 is a figure for demonstrating a method of determining the maximum gradient from a C-V characteristic.

In such a measuring system, when the direct voltage is scanned in the forward direction from the lowest voltage V1 to the highest voltage V2 (however, this is the third forward scanning), as shown in FIG. 2, typically beyond the first flat region, a first decreasing region appears where the capacitance decreases relatively large, and then the relatively flat region is observed. Subsequently, when the voltage is scanned in the negative direction from the highest voltage V2 to the lowest voltage V1, typically the regions are observed in the reverse order of the scanning in the forward direction. However, it does not match the curve of the forward scan, and hysteresis is often observed.

The above-mentioned "first decreasing region" is understood to be a stage in which the vicinity of the interface in the silicon wafer changes from a majority carrier accumulation layer to a depletion layer and the depletion layer is expanding. In the present invention, the maximum gradient (that is a negative value and a maximum absolute value) in the first decreasing region is defined as "maximum gradient". Therefore, the "maximum gradient" can be obtained as the absolute value of the apex of the negative peak appearing in the differential curve of the normalized C-V curve.

The polyimide of the present invention has a "maximum gradient" of 0.005/V or more, preferably more than 0.007/V, obtained by the above-mentioned C-V measurement for a 0.75 μm thick film formed on a silicon wafer having a resistivity of 4 Ωcm. The maximum gradient shows a larger value (larger absolute value) as the interfacial level density is smaller. It is considered that the surface state of the polyimide (for example, composition, functional group (particularly surface functional group), presence of impurities or additives, etc.) influences the interfacial level density. In the present invention, it is presumed that since the surface state of the polyimide at the interface with the semiconductor is in a very favorable state, it has a large "maximum gradient". Due to such a large "maximum gradient", when the polyimide of the present invention is used in an electronic device such as a display, the adverse effect on the operation or durability of the electronic device is small.

The development of a polyimide focused on such C-V characteristics has not been reported or actually carried out. Naturally, the existing polyimide does not satisfy the above C-V characteristics. Further, since the C-V characteristic is considered to affect the surface state of the polyimide, the chemical structure of the polyimide may be any structure as long as the C-V characteristic is satisfied.

<<Polyimide, Polyimide Precursor>>

The chemical structure of the polyimide of the present invention or its precursor (polyimide precursor) is not particularly limited as long as it satisfies the C-V characteristics, and the chemical structure may be appropriately selected depending on the desired function. The polyimide precursor has a repeating unit represented by the following general formula I:

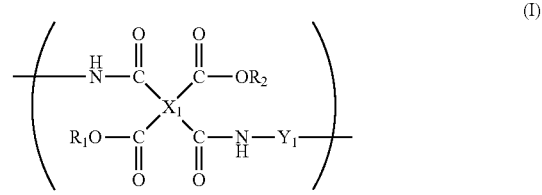

(I)

(in the general formula I, $X_1$ is a tetravalent aliphatic group or an aromatic group, $Y_1$ is a divalent aliphatic group or an aromatic group, and $R_1$ and $R_2$ are, independently of each other, a hydrogen atom, an alkyl group having 1 to 6 carbon atoms or an alkylsilyl group having 3 to 9 carbon atoms.). Particularly preferred is a polyamic acid in which $R_1$ and $R_2$ are hydrogen atoms. Also, partially imidized polymers. i.e. polymers containing repeating units in which at least one of the two amide structures in formula I is imidized, are also embraced by "polyimide precursors" and "polyamic acids" (in case that remaining $R_1$ and $R_2$ are hydrogen atoms).

The polyimide has a repeating unit represented by the following general formula II:

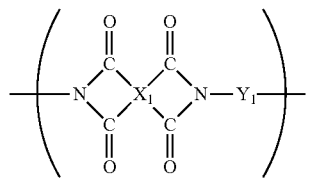
(II)

(wherein, $X_1$ is a tetravalent aliphatic group or an aromatic group, $Y_1$ is a divalent aliphatic group or an aromatic group.).

Hereinafter, the chemical structure of such polyimides will be described by the structures of $X_1$ and $Y_2$ in the repeating unit (general formula (II)) and the monomers (tetracarboxylic acid component, diamine component, and other components) used for production. Then, the manufacturing method will be described.

In the present specification, the tetracarboxylic acid component includes tetracarboxylic acid, tetracarboxylic dianhydride, and other tetracarboxylic acid derivatives such as tetracarboxylic acid silyl ester, tetracarboxylic acid ester and tetracarboxylic acid chloride, each of which is used as a raw material for producing a polyimide. Although not particularly limited, it is convenient to use tetracarboxylic acid dianhydride from the view point of production, and the following description will be made to examples using tetracarboxylic acid dianhydride as a tetracarboxylic acid component. Further, the diamine component is a diamine compound having two amino groups (—$NH_2$), which is used as a raw material for producing a polyimide.

In addition, in the present specification, a polyimide film means both a film formed on a substrate in a laminated state (a stacked state) and a film having no substrate supporting the film (including a self-supporting film). When used as a substrate, the polyimide of the present invention is preferably in a form of a film. Further, the polyimide of the present invention may be in a form of a layer that exists dispersedly on a support substrate or on a layer formed of a different material.

<<Structure in Repeating Unit and Monomer>>
<$X_1$ and Tetracarboxylic Acid Component>

$X_1$ of the tetravalent group having an aromatic ring is preferably a tetravalent group having an aromatic ring having 6 to 40 carbon atoms.

Examples of the tetravalent group having an aromatic ring include the followings.

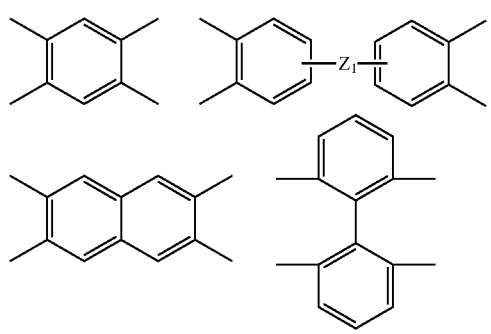
(2)

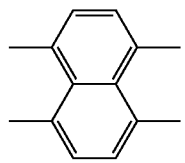

(wherein, $Z_1$ is a direct bond or any one of the following divalent groups:

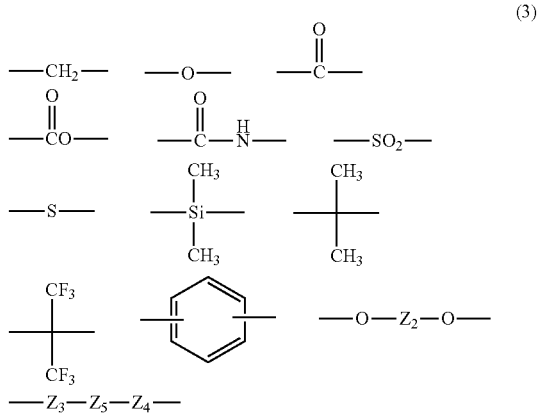
(3)

in the formulae, $Z_2$ is a divalent organic group, $Z_3$ and $Z_4$ are, independently of each other, amide bond, ester bond, or carbonyl bond, and $Z_5$ is a divalent organic group comprising an aromatic ring.)

Specific examples of $Z_2$ include aliphatic hydrocarbon groups having 2 to 24 carbon atoms and aromatic hydrocarbon groups having 6 to 24 carbon atoms.

Specific examples of $Z_5$ include aromatic hydrocarbon groups having 6 to 24 carbon atoms.

As the tetravalent group having an aromatic ring, the following ones are particularly preferable because the obtained polyimide material has both high heat resistance and high transparency.

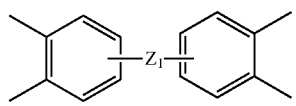
(9)

(in the formula, $Z_1$ is a direct bond or hexafluoroisoproylidene bond.)

Here, $Z_1$ is more preferably a direct bond because the obtained polyimide material has high heat resistance, high transparency, and a low coefficient of linear thermal expansion.

In addition, preferable groups include a compound of the above formula (9) in which $Z_1$ is a fluorenyl-containing group represented by the following formula (3A):

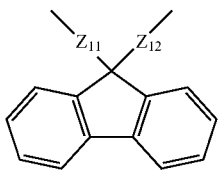
(3A)

$Z_{11}$ and $Z_{12}$ are, independently of each other and preferably the same, a single bond or a divalent organic group. $Z_{11}$ and $Z_{12}$ are preferably an organic group having an aromatic ring, and preferably a structure represented by, for example, formula (3A1):

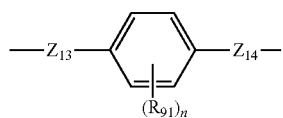
(3A1)

(wherein $Z_{13}$ and $Z_{14}$ are, independently of each other, single bond, —COO—, —OCO— or —O—; and if $Z_{14}$ is bonded to a fluorenyl group, a structure in which $Z_{13}$ is —COO—, —OCO— or —O— and $Z_{14}$ is a single bond is preferred; $R_{91}$ is an alkyl having 1 to 4 carbon atoms or phenyl group, preferably methyl, and n is an integer of 0 to 4, and preferably 1.).

Examples of the tetracarboxylic acid component that gives the repeating unit of the general formula (II) in which $X_1$ is a tetravalent group having an aromatic ring include, for example, 2,2-bis (3,4-dicarboxyphenyl) hexafluoropropane, 4-(2,5-dioxotetrahydrofuran-3-yl)-1,2,3,4-tetrahydronaphthalene-1,2-dicarboxylic acid, pyromellitic acid, 3,3',4,4'-benzophenone tetraarboxylic acid, 3,3',4,4'-biphenyltetracarboxylic acid, 2,3,3',4'-biphenyltetracarboxylic acid, 4,4'-oxydiphthalic acid, bis (3,4-dicarboxyphenyl)sulfone, m-terphenyl-3,4,3',4'-tetracarboxylic acid, p-terphenyl-3,4, 3',4'-tetracarboxylic acid, biscarboxyphenylmethylsilane, bis-dicarboxyphenoxy diphenyl sulfide, and sulfonyl diphthalate. The dianhydrides of these are preferably used as monomers. Examples of the tetracarboxylic acid component providing the repeating unit of the general formula (II) in which $X_1$ is a tetravalent group having an aromatic ring containing a fluorine atom include, for example, 2,2-bis (3,4-dicarboxyphenyl)hexafluoropropane dianhydride. Further, as a preferable compound, (9H-fluorene-9,9-diyl)bis (2-methyl-4,1-phenylene)bis(1,3-dioxo-1,3-dihydroisobenzofuran-5-carboxylate) is mentioned. The tetracarboxylic acid components may be used alone or in combination of two or more.

$X_1$ of the tetravalent group having an alicyclic structure is preferably a tetravalent group having an alicyclic structure having 4 to 40 carbon atoms, and further preferably at least one aliphatic 4- to 12-membered ring, and more preferably aliphatic 4-membered ring or an aliphatic 6-membered ring. Preferred tetravalent groups having an aliphatic 4-membered ring or an aliphatic 6-membered ring include the following.

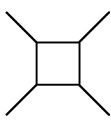 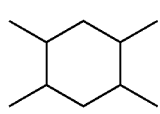
(10)

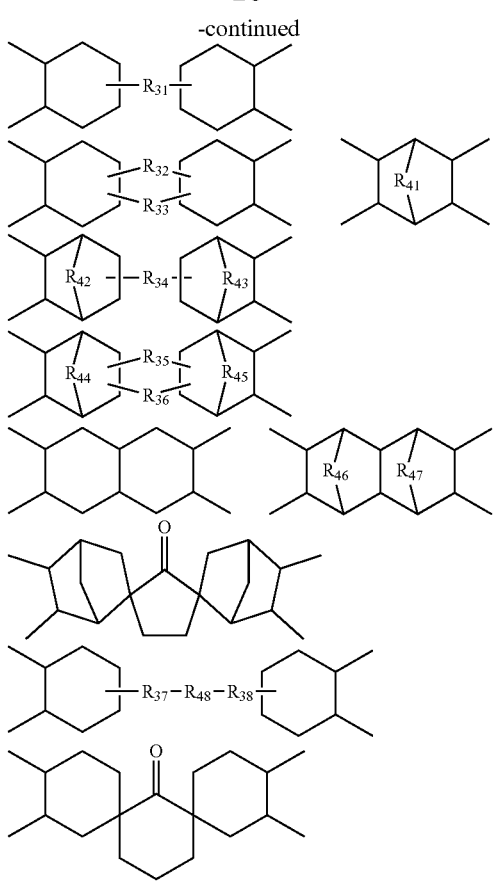

(in the formulae, $R_{31}$ to $R_{38}$ are, independently of each other, a direct bond or an organic group: $R_{41}$ to $R_{47}$ represent, independently of each other, one selected from the group consisting of formulae: —CH$_2$—, —CH=CH—, —CH$_2$CH$_2$—, —O—, —S—; $R_{48}$ is an organic group containing an aromatic ring or alicyclic ring structure.)

Specific examples of $R_{31}$, $R_{32}$, $R_{33}$, $R_{34}$, $R_{35}$, $R_{36}$, $R_{37}$ and $R_{38}$ include a direct bond, an aliphatic hydrocarbon group having 1 to 6 carbon atoms, or an oxygen atom (—O—), a sulfur atom (—S—), a carbonyl bond, an ester bond and an amide bond.

Examples of the organic group containing an aromatic ring as $R_{48}$ include the followings.

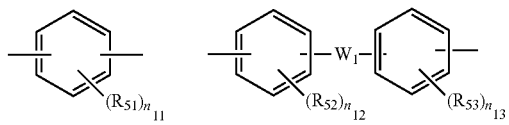
(4)

(in the formula, $W_1$ is a direct bond or an organic group; $n_{11}$ to $n_{13}$ represent, independently of each other, integer of 0 to 4; $R_{51}$, $R_{52}$, $R_{53}$ are, independently of each other, alkyl group having 1 to 6 carbon atoms, halogen group, hydroxyl group, carboxyl group, or trifluoromethyl group.)

Specific examples of $W_1$ include a direct bond, a divalent group represented by the following formula (5), and a divalent group represented by the following formula (6).

(5)

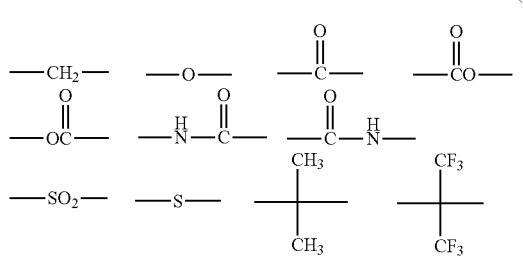

(6)

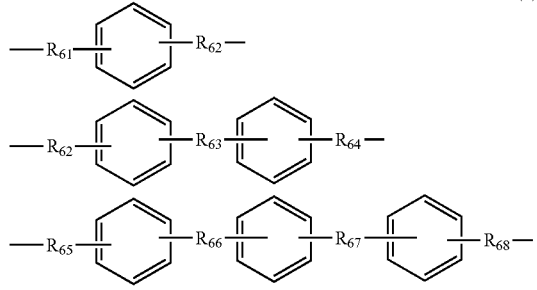

(in the formula (6), $R_{61}$ to $R_{68}$ represent, independently of each other, a direct bond, or any one of divalent groups represented by the above formula (5).)

As the tetravalent group having an alicyclic structure, the following ones are particularly preferable because the obtained polyimide has high heat resistance, high transparency, and a low coefficient of linear thermal expansion.

(11)

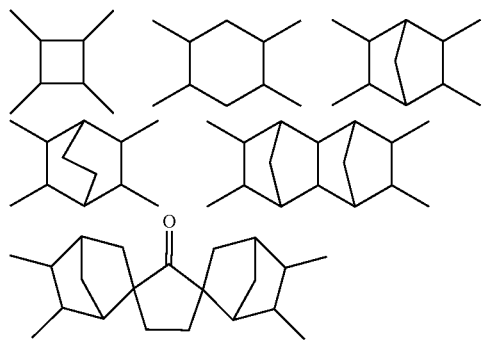

Examples of the tetracarboxylic acid component providing the repeating unit of the formula (II) in which $X_1$ is a tetravalent group having an alicyclic structure include, for example, 1,2,3,4-cyclobutanetetracarboxylic acid, isopropylidene diphenoxybisphthalic acid, cyclohexane-1,2,4,5-tetracarboxylic acid, [1,1'-bi (cyclohexane)]-3,3', 4,4'-tetracarboxylic acid, [1,1'-bi (cyclohexane)]-2,3,3', 4'-tetracarboxylic acid, [1,1'-bi (cyclohexane)]-2,2', 3,3'-tetracarboxylic acid, 4,4'-methylenebis(cyclohexane-1,2-dicarboxylic acid), 4,4'-(propane-2,2-diyl)bis(cyclohexane-1,2-dicarboxylic acid), 4,4'-oxybis(cyclohexane-1,2-dicarboxylic acid), 4,4'-thiobis (cyclohexane-1,2-dicarboxylic acid), 4,4'-sulfonylbis (cyclohexane-1,2-dicarboxylic acid), 4,4'-(dimethylsilanediyl) bis (cyclohexane-1,2-dicarboxylic acid), 4,4'-(tetrafluoropropane-2,2-diyl) bis (cyclohexane-1,2-dicarboxylic acid), octahydropentalene-1,3,4,6-tetracarboxylic acid, bicyclo[2.2.1]heptane-2,3,5,6-tetracarboxylic acid, 6-(carboxymethyl) bicyclo [2.2.1] heptane-2,3,5-tricarboxylic acid, bicyclo[2.2.2]octane-2,3,5,6-tetracarboxylic acid, bicyclo[2.2.2]oct-5-ene-2,3,7,8-tetracarboxylic acid, tricyclo[4.2.2.02.5]decane-3,4,7,8-tetracarboxylic acid, tricyclo[4.2.2.02.5]dec-7-ene-3,4,9,10-tetracarboxylic acid, 9-oxatricyclo[4.2.1.02.5]nonane-3,4,7,8-tetracarboxylic acid, norbornane-2-spiro-α-cyclopentanone-α'-spiro-2"-norbornane 5,5",6,6"-tetracarboxylic acid, (4arH,8acH)-decahydro-1t, 4t: 5c, 8c-dimethanonaphthalene-2c, 3c, 6c, 7c-tetracarboxylic acid, (4arH, 8acH)-decahydro-1t, 4t: 5c, 8c-dimethanonaphthalene-2t, 3t, 6c, 7c-tetracarboxylic acid, and their derivatives such as tetracarboxylic dianhydride, tetracarboxylic acid silyl esters, tetracarboxylic acid esters, and tetracarboxylic acid chloride. The tetracarboxylic acid component may be used alone or in combination of two or more.

<$Y_1$ and Diamine Component>

$Y_1$ of the divalent group having an aromatic ring is preferably a divalent group having an aromatic ring having 6 to 40 carbon atoms, and more preferably 6 to 20 carbon atoms.

Examples of the divalent group having an aromatic ring include the followings.

(4)

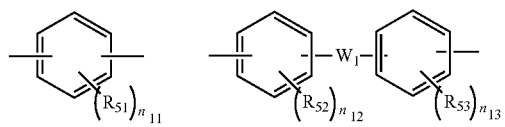

(in the formulae, $W_1$ is a direct bond or an organic group; $n_{11}$ to $n_{13}$ represent, independently of each other, integer of 0 to 4; $R_{51}$, $R_{52}$, $R_{53}$ are, independently of each other, alkyl group having 1 to 6 carbon atoms, halogen group, hydroxyl group, carboxyl group, or trifluoromethyl group.)

Specific examples of W1 include a direct bond, a divalent group represented by the following formula (5), and a divalent group represented by the following formula (6).

(5)

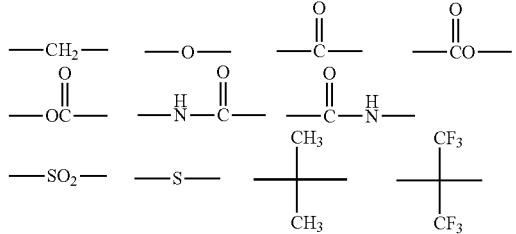

(6)

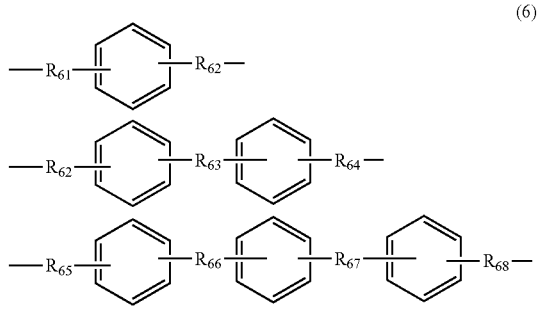

(in the formula (6), $R_{61}$ to $R_{68}$ represent, independently of each other, a direct bond, or any one of divalent groups represented by the above formula (5).)

Here, since the high heat resistance, high transparency, and low linear thermal expansion coefficient of the obtained polyimide can be achieved at the same time, $W_1$ is particularly preferably a direct bond, or one selected from the group consisting of the groups represented by the formulae: —NHCO—, —CONH—, —COO—, —OCO—. It is also particularly preferable that $W_1$ is a divalent group represented by the formula (6) in which $R_{61}$ to $R_{68}$ are a direct bond, or one selected from the group consisting of groups represented by the formulae: —NHCO—, —CONH—, —COO—, and —OCO—.

In addition, preferable groups include a compound of the above formula (4) in which $W_1$ is a fluorenyl-containing group represented by the following formula (3B):

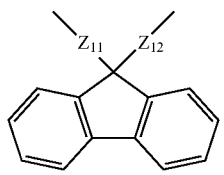

(3B)

$Z_{11}$ and $Z_{12}$ are, independently of each other and preferably the same, a single bond or a divalent organic group. $Z_{11}$ and $Z_{12}$ are preferably an organic group having an aromatic ring, and preferably a structure represented by, for example, formula (3B1):

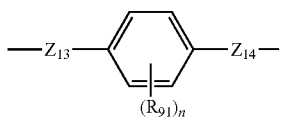

(3B1)

(wherein $Z_{13}$ and $Z_{14}$ are, independently of each other, single bond, —COO—, —OCO— or —O—; and if $Z_{14}$ is bonded to a fluorenyl group, a structure in which $Z_{13}$ is —COO—, —OCO— or —O— and $Z_{14}$ is a single bond is preferred; $R_{91}$ is an alkyl group having 1 to 4 carbon atoms or phenyl group, and preferably methyl; and n is an integer of 0 to 4, and preferably 1.).

Other preferable groups include a compound of the above formula (4) in which $W_1$ is a phenylene group, that is, a terphenyldiamine compound. In particular, a compound having all para bonds is preferable.

Other preferable groups include a compound of the above formula (4) in which $W_1$ is the first structure having one phenyl ring in the formula (6) wherein $R_{61}$ and $R_{62}$ are 2,2-propylidene groups.

Still other preferable groups include a compound of the above formula (4) in which $W_1$ is represented by the following formula (3B2):

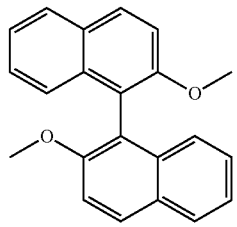

Examples of the diamine component which provides the repeating unit of the general formula (II) in which $Y_1$ is a divalent group having an aromatic ring include, for example, p-phenylenediamine, m-phenylenediamine, benzidine, 3,3'-diamino-biphenyl, 2,2'-bis (trifluoromethyl) benzidine, 3,3'-bis (trifluoromethyl) benzidine, m-tolidine, 4,4'-diaminobenzanilide, 3,4'-diaminobenzanilide, N, N'-bis(4-aminophenyl)terephthalamide, N, N'-p-phenylene bis(p-aminobenzamide), 4-aminophenoxy-4-diaminobenzoate, bis (4-aminophenyl)terephthalate, biphenyl-4,4'-dicarboxylic acid bis(4-aminophenyl) ester, p-phenylene bis(p-aminobenzoate), bis(4-aminophenyl)-[1,1'-biphenyl]-4,4'-dicarboxylate, [1,1'-biphenyl]-4,4'-diylbis(4-aminobenzoate), 4,4'-oxydianiline, 3,4'-oxydianiline, 3,3'-oxydianiline, p-methylene bis(phenylenediamine), 1,3-bis(4-aminophenoxy)benzene, 1,3-bis(3-aminophenoxy)benzene, 1,4-bis(4-aminophenoxy)benzene, 4,4'-bis(4-aminophenoxy)biphenyl, 4,4'-bis(3-aminophenoxy)biphenyl, 2,2-bis (4-(4-aminophenoxy)phenyl)hexafluoropropane, 2,2-bis(4-aminophenyl) hexafluoropropan, bis(4-aminophenyl) sulfone, 3,3'-bis(trifluoromethyl) benzidine, 3,3'-bis((aminophenoxy)phenyl)propane, 2,2'-bis(3-amino-4-hydroxyphenyl)hexafluoropropane, bis(4-(4-aminophenoxy)diphenyl) sulfone, bis(4-(3-aminophenoxy)diphenyl) sulfone, octafluorobenzidine, 3,3'-dimethoxy-4,4'-diaminobiphenyl, 3,3'-dichloro-4,4'-diaminobiphenyl, 3,3'-difluoro-4,4'-diaminobiphenyl, 2,4-bis(4-aminoanilino)-6-amino-1,3,5-triazine, 2,4-bis (4-aminoanilino)-6-methylamino-1,3,5-triazine, 2,4-bis (4-aminoanilino)-6-ethylamino-1,3,5-triazine and 2,4-bis (4-aminoanilino)-6-anilino-1,3,5-triazine. Examples of the diamine component which provides the repeating unit of the general formula (II) in which $Y_1$ is a divalent group having an aromatic ring containing a fluorine atom include, for example, 2,2'-bis(trifluoromethyl) benzidine, 3, 3'-bis(trifluoromethyl) benzidine, 2,2-bis [4-(4-aminophenoxy) phenyl]hexafluoropropane, 2,2-bis(4-aminophenyl) hexafluoropropane, 2,2'-bis (3-amino-4-hydroxyphenyl)hexafluoropropane. In addition, examples of the preferable diamine compound include, 4,4'-(((9H-fluorene-9,9-diyl)bis([1,1'-biphenyl]-5,2-diyl))bis(oxy))diamine, [1,1': 4', 1"-terphenyl]-4,4"-diamine, and 4,4'-([1,1'-binaphthalene]-2,2'-diylbis (oxy))diamine. The diamine component may be used alone or in combination of two or more.

$Y_1$ of the divalent group having an alicyclic structure is preferably a divalent group having an alicyclic structure having 4 to 40 carbon atoms, and further preferably at least one aliphatic 4- to 12-membered ring, and more preferably aliphatic 6-membered ring.

Examples of the divalent group having an alicyclic structure include the followings.

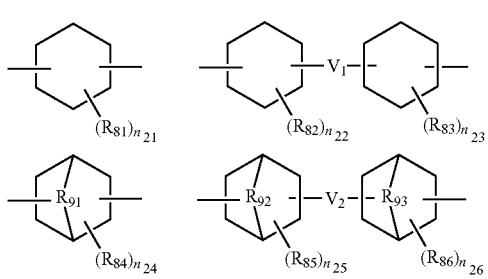

(12)

(in the formulae, $V_1$ and $V_2$ are, independently of each other, a direct bond or an organic group; $n_{21}$ to $n_{26}$ represent, independently of each other, integer of 0 to 4; $R_{81}$ to $R_{86}$ are, independently of each other, alkyl group having 1 to 6 carbon atoms, halogen group, hydroxyl group, carboxyl group, or trifluoromethyl group; $R_{91}$, $R_{92}$, and $R_{93}$ represent, independently of each other, one selected from the group consisting of formulae: —$CH_2$—, —CH=CH—, —$CH_2CH_2$—, —O—, —S—.)

Specific examples of $V_1$ and $V_2$ include a direct bond and a divalent group represented by the above formula (5).

As the divalent group having an alicyclic structure, the following ones are particularly preferable because the obtained polyimide has both high heat resistance and a low linear thermal expansion coefficient.

(13)

As the divalent group having an alicyclic structure, in particular, the following ones are particularly preferable.

(14)

Examples of the diamine component which provides the repeating unit of the general formula (II) in which $Y_1$ is a divalent group having an alicyclic structure include, for example, 1,4-diaminocyclohexane, 1,4-diamino-2-methylcyclohexane, 1,4-diamino-2-ethylcyclohexane, 1,4-diamino-2-n-propylcyclohexane, 1,4-diamino-2-isopropylcyclohexane, 1,4-diamino-2-n-butylcyclohexane, 1,4-diamino-2-isobutylcyclohexane, 1,4-diamino-2-sec-butylcyclohexane, 1,4-diamino-2-tert-butylcyclohexane, 1,2-diaminocyclohexane, 1,3-diaminocyclobutane 1,4-bis(aminomethyl)cyclohexane, 1,3-bis (aminomethyl)cyclohexane, diaminobicycloheptane, diaminomethylbicycloheptane, diaminooxybicycloheptane, diaminomethyloxybicycloheptane, isophoronediamine, diaminotricyclodecane, diaminomethyltricyclodecane, bis(aminocyclohexyl)methane, bis(aminocyclohexyl)isopropylidene, 6,6'-bis(3-aminophenoxy)-3,3,3',3'-tetramethyl-1,1'-spirobiindane, 6,6'-bis (4-aminophenoxy)-3,3,3',3'-tetramethyl-1,1'-spirobiindane. The diamine component may be used alone or in combination of two or more.

In addition to the above tetracarboxylic acid component and diamine component, it is also preferable to add a carboxylic acid monoanhydride for reaction. The carboxylic acid monoanhydride is particularly preferably a dicarboxylic acid monoanhydride, and may be an aromatic carboxylic acid monoanhydride or an aliphatic carboxylic acid monoanhydride. Particularly, aromatic carboxylic acid monoanhydride is preferable. The aromatic carboxylic acid monoanhydride preferably has an aromatic ring having 6 to 30 carbon atoms, more preferably has an aromatic ring having 6 to 15 carbon atoms, and further more preferably has an aromatic ring having 6 to 10 carbon atoms.

Examples of the carboxylic acid monoanhydride include aromatic carboxylic acid monoanhydride, such as phthalic anhydride, 2,3-benzophenone dicarboxylic anhydride, 3,4-benzophenone dicarboxylic anhydride, 1,2-naphthalenedicarboxylic anhydride, 2,3-naphthalenedicarboxylic anhydride, 1,8-naphthalenedicarboxylic anhydride, 1,2-anthracene dicarboxylic anhydride, 2,3-anthracene dicarboxylic anhydride, and 1,9-anthracene dicarboxylic anhydride; and alicyclic carboxylic acid monoanhydrides, such as maleic anhydride, succinic anhydride, tetrahydrophthalic anhydride, hexahydrophthalic anhydride, itaconic anhydride and trimellitic anhydride. Among these, phthalic anhydride is preferable.

When the carboxylic acid monoanhydride is added, it is more preferable that the following equations (1) and (2) are satisfied.

$$0.97 \leq X/Y < 1.00 \qquad \text{Equation (1)}$$

$$0.5 \leq (Z/2)/(Y-X) \leq 1.05 \qquad \text{Equation (2)}$$

(wherein X represents a number of moles of tetracarboxylic acid component, Y represents a number of moles of diamine component, and Z represents a number of moles of the carboxylic acid monoanhydride.)

When X/Y is 0.97 or more, the molecular weight of the polyimide precursor (particularly polyamic acid) is increased, and the strength and heat resistance of the obtained polyimide film are improved. X/Y is preferably 0.98 or more. When X/Y is less than 1.00, the diamine component becomes excessive with respect to the tetracarboxylic acid component. By doing so, amino groups are formed that are capable of end-capping with a carboxylic acid monoanhydride. X/Y is preferably 0.99 or less.

Further, (Z/2)/(Y-X) represents the molar ratio of the carboxylic acid monoanhydride and the amino group capable of end-capping. When X/Y is less than 1.00 and (Z/2)/(Y-X) is 0.5 or more, the end-capping ratio of the polyimide precursor can be increased, and the C-V characteristics can be improved. The closer (Z/2)/(Y-X) is to 1, the more preferable. (Z/2)/(Y-X) is preferably 0.6 or more, more preferably 0.7 or more. When (Z/2)/(Y-X) is 1.05 or less, the amount of free carboxylic acid monoanhydride can be reduced and the strength and the C-V characteristics of the obtained polyimide film can be increased. (Z/2)/(Y-X) is preferably 1.03 or less, more preferably 1.01 or less.

In one embodiment of the present invention, the weight ratio of the imide group (—C(O)NC(O)—) in the polyimide repeating unit (i.e., the general formula II) is preferably less than 38.3% by weight. In a particular embodiment, it is more preferably 30% by weight or less.

Here, the polyimide may be a copolymer. That is, at least one of the tetracarboxylic acid component and the diamine component which give the polyimide may contain two or more kinds of compounds. In this case, the weight ratio of the imide group is calculated as a weighted average based on the feed ratio of the monomers. The weight ratio of groups other than the imide group is calculated in the same manner. In the following description, when referring to the weight ratio of a specific group, the polyimide includes both a homopolymer and a copolymer.

In one embodiment of the present invention, it is preferable that the weight ratio of the functional group in the polyimide repeating unit is small. The "functional group in the repeating unit" defined herein is a portion other than the aromatic ring and the saturated alkyl chain in the polyimide repeating unit, and is —O— (ether bond), —CO— (carbonyl group), —COO— (ester), —SO$_2$— and the like. F and Cl substituting hydrogen(s) of the aromatic ring or the saturated alkyl chain are not included in the "functional group in the repeating unit".

It is also preferable that the total amount of the imide group and the "functional group in the repeating unit" is less than 38.3% by weight in the polyimide repeating unit, more preferably 30% by weight or less, further preferably 25% by weight or less.

In addition, in one embodiment of the present invention, it is preferable that the content of the functional group other than the above is small, regardless of whether it is present in the polyimide repeating unit, is present at the terminal, or is another compound. It is also very preferable that they are not included at all. Examples of such undesired functional groups include Si-containing groups (siloxane bond, silyl group, and the like).

In a preferred embodiment of the present invention, the tetracarboxylic acid component forming the repeating unit preferably comprises a compound selected from tetracarboxylic dianhydrides having a fluorene structure in the molecule, and a tetracarboxylic dianhydrides having three or more benzene rings per one functional group other than two acid anhydride groups (corresponding to the above-mentioned "functional group in the repeating unit"). In addition, a compound having no functional group corresponding to the "functional group in the repeating unit" other than the two acid anhydride groups is also included in the preferable compounds. In this case, the number of benzene rings is preferably 2 or more and more preferably 3 or more.

In a preferred embodiment of the present invention, the diamine component forming the repeating unit preferably comprises a compound selected from diamines having a fluorene structure in the molecule, and diamines having three or more benzene rings per one functional group other than two amine groups (corresponding to the above-mentioned "functional group in repeating unit"). In addition, a compound having no functional group corresponding to the "functional group in the repeating unit" other than two amine groups is also included in the preferable compounds. In this case, the number of benzene rings is preferably 2 or more and more preferably 3 or more.

In a preferred embodiment of the present invention, each of the tetracarboxylic acid component and the diamine component forming the repeating unit preferably comprises compounds selected from the above-mentioned conditions, that is, from compounds having a fluorene structure in the molecule and compounds having three or more benzene rings per one "functional group in the repeating unit" (including the case of having no functional group).

In one aspect of the present invention, it is also preferable that the "amount of terminal functional group" is small. "Amount of terminal functional group" is calculated based on the feeding ratio of a tetracarboxylic acid component and a diamine component when producing a polyimide (when producing a polyamic acid), the purity of each component, an addition amount of the terminal capping agent, and a reactive additive. The calculation of the amount of the terminal functional group based on the feed ratio of the tetracarboxylic acid component and the diamine component is carried out as follows.

Since the degree of polymerization of the polyimide obtained with "tetracarboxylic dianhydride/diamine ratio=1" is theoretically ∞ (infinite), the amount of the terminal group is 1/∞=0. If the feeding amount of tetracarboxylic dianhydride and diamine are not equimolar, and the amount of diamine is excessive, the polyimide having a structure of the formula (II-B) and having a polymerization degree of n can be theoretically obtained, n can be obtained by determining n that satisfies:

tetracarboxylic dianhydride/diamine ratio=$n(n+1)$.  (Equation)

When the formula weight of the repeating unit is "a" and the molecular weight of one terminal diamine is "$a_b$", the formula weight of a polyimide having a degree of polymerization of n is ($a*n+a_b$). Therefore, the amount of terminal amine is determined by:

$2/(a*n+a_b)$ [unit: mol/g].

In the examples of the present application, it is expressed in µmol/g.

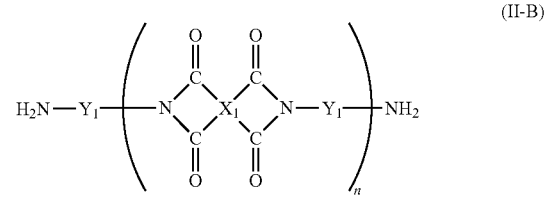

(II-B)

In one embodiment of the present invention, the amount of terminal amine groups is preferably 30 µmol/g or less, more preferably 20 µmol/g or less, still more preferably 10.5 µmol/g or less. Further, in a different aspect of the present invention, the total amount of functional groups at the terminals is preferably 30 µmol/g or less, more preferably 20 µmol/g or less, still more preferably 10.5 µmol/g or less.

In a preferred embodiment of the present invention, it is preferable that the total weight ratio of the imide group and the "functional group in the repeating unit" is 30% by weight or less and the "amount of terminal functional group" is 20 µmol/g or less. In another preferred embodiment, it is preferable that the total weight ratio of the imide group and the "functional group in the repeating unit" is 40% by weight or less and the "amount of terminal functional group" is 10.5 µmol/g or less. It is also very preferable that the total weight ratio of the imide group and the "functional group in the repeating unit" is 30% by weight or less and the "amount of terminal functional group" is 10.5 µmol/g or less.

Control of the functional groups (imide group, functional group in repeating unit, terminal functional group) in polyimide as described above is an element that should be considered in order to obtain a polyimide having the C-V characteristics of the present invention.

<<New Polyimide Precursor and Polyimide>>

The present application also discloses a polyimide precursor and a polyimide having a novel structure. The novel polyimide precursor and polyimide include a repeating unit which is derived from:

a tetracarboxylic acid component (A) comprising at least 3,3', 4,4'-biphenyltetracarboxylic dianhydride (s-BPDA), and
a diamine component (B) comprising:
(B-1) at least one diamine selected from 1,4-diaminobenzene, [1,1': 4',1''-terphenyl]-4,4''-diamine, and 1,4-bis[2-(4-aminophenyl)-2-propyl]benzene, and
(B-2) at least one diamine selected from 9,9-bis(4-aminophenyl) fluorene, 4,4'-(((9H-fluorene-9,9-diyl)bis([1,1'-biphenyl]-5,2-diyl))bis(oxy))diamine, and 4,4'-([1,1'-binaphthalene]-2,2'-diylbis(oxy))diamine.

Namely, in the general formulas I and II, the repeating unit comprises $X_1$ that is derived from the tetracarboxylic acid component (A) and $Y_1$ that is derived from the diamine component (B).

The tetracarboxylic acid component (A) preferably comprises 3,3', 4,4'-biphenyltetracarboxylic dianhydride (s-BPDA) in a proportion of 40 mol % or more. It is also preferred that the tetracarboxylic acid component (A) comprises, besides s-BPDA, (9H-fluorene-9,9-diyl)bis(2-methyl-4,1-phenylene)bis(1,3-dioxo-1, (3-dihydroisobenzofuran-5-carboxylate). In addition to these, the above-listed tetracarboxylic dianhydride can be included. For example, it is possible to include tetracarboxylic dianhydride(s) selected from a tetracarboxylic dianhydride having a fluorene structure in the molecule and a tetracarboxylic dianhydrides having three or more benzene rings per one functional group other than two acid anhydride groups (corresponding to the above-mentioned "functional group in the repeating unit"). The amount of tetracarboxylic dianhydride, other than s-BPDA and (9H-fluorene-9,9-diyl)bis(2-methyl-4,1-phenylene)bis(1,3-dioxo-1, (3-dihydroisobenzofuran-5-carboxylate), is preferably 30 mol % or less, more preferably 20 mol % or less, and may be 0 mol %.

The diamine component (B) comprises the above-mentioned diamine (B-1) and diamine (B-2) in a proportion of preferably 40 mol % or more in total. Further, as the diamine component (B), in addition to the diamine (B-1) and the diamine (B-2), the above-listed diamine compounds may be contained. For example, it is possible to include diamine(s) selected from diamines having a fluorene structure in the molecule, and diamines having three or more benzene rings per one functional group other than two amine groups (corresponding to the above-mentioned "functional group in repeating unit"), and the examples of preferable compounds include 1,1': 4', 1'': 4'', 1'''-quaterphenyl-4,4'''-diamine and the like. The amount of the diamine compound other than the diamine (B-1) and the diamine (B-2) is preferably 30 mol % or less, more preferably 20 mol % or less, and may be 0 mol %.

Further, in the repeating unit of the polyimide precursor or the polyimide, the total proportion of the repeating units derived from s-BPDA and the diamine (B-1) and the repeating units derived from the s-BPDA and the diamine of (B-2) is preferably 40 mol % or more.

This novel polyimide has excellent in C-V characteristics. It is preferable to select a compound used in combination, feeding ratio of tetracarboxylic dianhydride/diamine and the like so that at least one, preferably two, and more preferably three among (i) a weight ratio of the imide group in the polyimide repeating unit, (ii) a weight ratio of the imide group and the "functional group in the repeating unit" in total, and (iii) "amount of terminal functional group", are in the above-mentioned range (particularly in the preferable range).

<<Method for Manufacturing Polyimide Film>>

A method for manufacturing polyimide, particularly a method for manufacturing a polyimide film via a laminate having a polyimide film formed on a carrier substrate, will be described below.

Examples of a process for manufacturing a polyimide film generally include:
(1) a process comprising flow-casting, on a carrier substrate, a polyimide precursor (particularly polyamic acid) solution, or a polyimide precursor solution composition containing, as necessary, additives selected from an imidization catalyst, a dehydrating agent, and inorganic fine particles in a polyimide precursor solution, and heating to perform cyclodehydration and removal of a solvent to give a polyimide film (thermal imidization);
(2) a process comprising flow-casting, on a carrier substrate, a polyimide precursor solution composition containing a cyclization catalyst and a dehydrating agent and, as necessary, a further selected additive such as inorganic fine particles in a polyimide precursor (particularly polyamic acid) solution; and then chemically cyclodehydrating it and heating to perform removal of a solvent and imidization to give a polyimide film (chemical imidization); and
(3) when a polyimide is soluble in an organic solvent, a process comprising flow-casting, on a carrier substrate, a polyimide solution composition containing, as necessary, a selected additive such as inorganic fine particles in a polyimide solution, and heating to a predetermined temperature while removing a solvent to give a polyimide film.

<Polyimide Precursor Solution, Polyimide Solution>

First, the production of the polyimide precursor solution and the polyimide solution will be described. The polyimide precursor solution or the polyimide solution is obtained by polymerizing approximately equimolar amounts of a tetracarboxylic acid component and a diamine component in an organic solvent. Alternatively, it is also possible to prepare two or more polyimide precursors in advance in which either of components is excessively fed, then combining the polyimide precursor solutions and mixing them under reaction conditions.

The solvent used herein is not particularly limited, and examples thereof include amide solvents such as N,N-dimethylformamide, N,N-dimethylacetamide, N,N-diethylacetamide, N-methyl-2-pyrrolidone, N-ethyl-2-pyrrolidone and N-vinyl-2-pyrrolidone; cyclic ester solvents such as γ-butyrolactone, γ-valerolactone, δ-valerolactone, γ-caprolactone, ε-caprolactone and α-methyl-γ-butyrolactone; carbonate solvents such as ethylene carbonate and propylene carbonate; glycol-based solvents such as triethylene glycol; phenol-based solvent such as m-cresol, p-cresol, 3-chlorophenol and 4-chlorophenol; acetophenone, 1,3-dimethyl-2-imidazolidinone, sulfolane, dimethyl sulfoxide and the like. Further, other general organic solvents may be used, for example, alcohol solvents such as methanol and ethanol, phenol, o-cresol, butyl acetate, ethyl acetate, isobutyl acetate, propylene glycol methyl acetate, ethyl cellosolve, butyl cellosolve, 2-methyl cellosolve acetate, ethyl cellosolve acetate, butyl cellosolve acetate, tetrahydrofuran, dimethoxyethane, diethoxyethane, dibutyl ether, diethylene glycol dimethyl ether, methyl isobutyl ketone, diisobutyl ketone, cyclopentanone, cyclohexanone, methyl ethyl ketone, acetone, butanol, ethanol, xylene, toluene, chlorobenzene, N-methylcaprolactam, hexamethylphosphorotriamide, bis(2-methoxyethyl)ether, 1,2-bis(2-methoxyethoxy)

ethane, bis[2-(2-methoxyethoxy)ethyl] ether, 1,4-dioxane, dimethyl sulfoxide, dimethyl sulfone, diphenyl ether, diphenyl sulfone, tetramethyl urea, anisole, terpene, mineral spirits, petroleum naphtha solvent, biodegradable methyl lactate, ethyl lactate, butyl lactate, and the like. The organic solvent used herein may be one kind or two or more kinds.

When carrying out the polymerization reaction for obtaining the polyimide precursor solution and the polyimide solution, respectively, the concentration of all monomers in the organic solvent (substantially equal to the solid content concentration of the polyimide precursor solution or the polyimide solution) may be appropriately selected according to the purpose of use or production. The solid content concentration of the obtained polyimide precursor solution or polyimide solution is not particularly limited, but is preferably 5% by mass to 45% by mass, preferably 7% by mass to 40% by mass, more preferably 9% by mass to 30% by mass based on the total amount of the polyimide precursor or the polyimide and the solvent. When the solid content concentration is lower than 5% by mass, the productivity and handling during use may be poor in some cases, and when it is higher than 45% by mass, the fluidity of the solution may be lost in some cases.

The solution viscosity of the polyimide precursor solution or the polyimide solution at 30° C. is not particularly limited, but is preferably 1000 Pa·s or less, more preferably 0.1 to 500 Pa·s, further preferably 0.1 to 300 Pa·s and particularly preferably 0.1 to 200 Pa·s from the view point of handling. If the solution viscosity exceeds 1000 Pa·s, the fluidity may be lost and uniform application onto a carrier substrate such as metal or glass may become difficult in some cases. If the solution viscosity is lower than 0.1 Pa·s, dripping, cissing and the like may occur during application onto a carrier substrate such as metal or glass in some cases, and it may be difficult to obtain a polyimide film having high characteristics.

As an example of the production of the polyimide precursor solution, the polymerization reaction of the tetracarboxylic acid component and the diamine component may be carried out by, for example, mixing them either with substantially equimolar or with one of components (acid component or diamine component) a little excessive, and reacting them at a reaction temperature of 100° C. or lower, preferably 80° C. or lower for about 0.2 to 60 hours to obtain a polyimide precursor solution.

As an example of the production of the polyimide solution, the polymerization reaction of the tetracarboxylic acid component and the diamine component may be carried out, for example, after mixing them either with substantially equimolar or with one of components (acid component or diamine component) a little excessive by a known method to obtain a polyimide solution. For example, the reaction may be carried out by reacting them at a reaction temperature of 140° C. or higher, preferably 160° C. or higher (preferably 250° C. or lower, further 230° C. or lower) for about 1 to 60 hours to obtain a polyimide solution.

In case that a carboxylic acid monoanhydride (particularly dicarboxylic acid monoanhydride) is added as described above, generally preferred is a method comprising a first step of obtaining a polyimide precursor (particularly polyamic acid) having amino group(s) at terminal(s) by reacting a tetracarboxylic acid component and a diamine component in a solvent at a molar ratio satisfying the equation (1); and a second step of reacting a carboxylic acid monoanhydride at a molar ratio satisfying the equation (2) to end-cap the polyimide precursor (particularly polyamic acid).

In the first step, in order to suppress the imidization reaction, it is carried out at a relatively low temperature of, for example, 100° C. or lower, preferably 80° C. or lower. Although not limited, the reaction temperature is usually 25° C. to 100° C., preferably 40° C. to 80° C., more preferably 50° C. to 80° C., and the reaction time is usually about 0.1 to 24 hours, preferably about 2 to 12 hours. By setting the reaction temperature and the reaction time within the above ranges, a solution composition of polyimide precursor having a high molecular weight can be efficiently obtained. While the reaction can be carried out under an air atmosphere, it is usually carried out under an inert gas atmosphere, preferably a nitrogen gas atmosphere.

In the second step, the reaction temperature may be appropriately set, but from the viewpoint of ensuring the capping of the end(s) of the polyimide precursor, it is preferably 25° C. to 70° C., more preferably 25° C. to 60° C., sill more preferably 25° C. to 50° C. The reaction time is usually about 0.1 to 24 hours.

The polyimide precursor solution or the polyimide solution thus obtained can be used as it is, or if necessary, the organic solvent may be removed or a new organic solvent can be added for the production of a polyimide film.

In the case of thermal imidization, an imidization catalyst, an organic phosphorus-containing compound, inorganic fine particles and the like may be added to the polyimide precursor solution if necessary. In the case of chemical imidization, a cyclization catalyst, a dehydrating agent, inorganic fine particles and the like may be added to the polyimide precursor solution if necessary. To a polyimide solution, inorganic fine particles may be added if necessary.

Examples of the imidization catalyst include a substituted or unsubstituted nitrogen-containing heterocyclic compound, an N-oxide compound of the nitrogen-containing heterocyclic compound, a substituted or unsubstituted amino acid compound, an aromatic hydrocarbon compound having a hydroxyl group, or an aromatic heterocyclic compound. In particular, preferably used compounds include lower alkyl imidazoles such as 1,2-dimethylimidazole, N-methylimidazole, N-benzyl-2-methylimidazole, 2-methylimidazole, 2-ethyl-4-methylimidazole, and 5-methylbenzimidazole; benzimidazoles such as N-benzyl-2-methylimidazole; phenylimidazoles such as 2-phenylimidazole; and substituted pyridines such as isoquinoline, 3,5-dimethylpyridine, 3,4-dimethylpyridine, 2,5-dimethylpyridine, 2,4-dimethylpyridine, and 4-n-propylpyridine. The amount of the imidization catalyst used is preferably 0.01 to 2 times equivalent, and more preferably 0.02 to 1 times equivalent to the amide acid unit of the polyamic acid. The use of the imidization catalyst may improve the physical properties of the obtained polyimide film, particularly the elongation and the end-cleave resistance.

Examples of the organic phosphorus-containing compound include phosphoric acid esters such as monocaproyl phosphate, monooctyl phosphate, monolauryl phosphate, monomyristyl phosphate, monocetyl phosphate, monostearyl phosphate, phosphate monoester of triethylene glycol monotridecyl ether, phosphate monoester of tetraethylene glycol monolauryl ether, phosphate monoester of diethylene glycol monostearyl ether, dicaproyl phosphate, dioctyl phosphate, dicapryl phosphate, dilauryl phosphate, dimyristyl phosphate, dicetyl phosphate, distearyl phosphate, phosphate diester of tetraethylene glycol mononeopentyl ether, phosphate diester of triethylene glycol monotridecyl ether, phosphate diester of tetraethylene glycol monolauryl ether, phosphate diester of diethylene glycol monostearyl ether, phosphate triesters such as trimethyl phosphate and triphenyl phosphate; and amine salts of these phosphoric acid esters. Examples of the amine include ammonia, monomethylamine, monoethylamine, monopropylamine, monobutylamine, dimethylamine, diethylamine, dipropylamine, dibutylamine, trimethylamine, triethylamine, tripropylamine, tributylamine, monoethanolamine, diethanolamine, triethanolamine, and the like.

Cyclization catalysts include aliphatic tertiary amines such as trimethylamine and triethylenediamine, aromatic tertiary amines such as dimethylaniline, and heterocyclic tertiary amines such as isoquinoline, pyridine, α-picoline and ß-picoline and the like.

Examples of the dehydrating agent include aliphatic carboxylic acid anhydrides such as acetic anhydride, propionic anhydride, butyric anhydride, and aromatic carboxylic acid anhydrides such as benzoic anhydride.

Examples of the inorganic fine particles include inorganic oxide powders in a fine particle form such as titanium dioxide powder, silicon dioxide (silica) powder, magnesium oxide powder, aluminum oxide (alumina) powder, and zinc oxide powder; inorganic nitride powders in a fine particle form such as silicon nitride powder, and titanium nitride powder; inorganic carbide powders such as silicon carbide powders; and inorganic salt powders in a fine particle form such as calcium carbonate powders, calcium sulfate powders, and barium sulfate powders. These inorganic fine particles may be used in combination of 2 or more types. In order to uniformly disperse these inorganic fine particles, means which are known per se can be used.

In one embodiment, the polyimide precursor solution or the polyimide solution preferably does not contain a silane coupling agent such as alkoxysilane. In a polyimide film using a silane coupling agent, the silane coupling agent may bleed out. This causes problems such as a decrease in C-V characteristics of the polyimide film, a decrease in adhesive strength, and swelling of the laminate. Furthermore, when a silane coupling agent is added to or reacted with the polyimide precursor solution, there is a problem that the viscosity stability of the polyimide precursor solution decreases. In order to avoid such problems, it is preferable not to use a silane coupling agent.

<Production of Laminate and Electronic Device>

In the production of an electronic device, first, a polyimide film is formed by casting a polyimide precursor solution or a polyimide solution (including a composition solution containing an additive if necessary) on a carrier substrate, heat-treating it for imidization and desolvation (mainly desolvation in the case of a polyimide solution) to obtain a laminate of a carrier substrate and a polyimide film. The carrier substrate is not limited, but generally, a glass substrate of soda lime glass, borosilicate glass, non-alkali glass or the like, or a metal substrate of iron, stainless steel, copper or the like is used. The method for casting the polyimide precursor solution and the polyimide solution on the carrier substrate is not particularly limited, and examples thereof include conventionally known methods such as spin coating, screen printing, bar coating, and electrodeposition. The heat treatment conditions when the polyimide precursor solution is used are not particularly limited, but the treatment is carried out, after dried in the temperature range of 50° C. to 150° C., at the maximum heating temperature of, for example, 150° C. to 600° C., preferably 200° C. to 550° C., more preferably 250° C. to 500° C. The heat treatment conditions when the polyimide solution is used are not particularly limited, but the maximum heating temperature is, for example, 100° C. to 600° C., preferably 150° C. or higher, more preferably 200° C. or higher, and preferably 500° C. or less, more preferably 450° C. or less.

The thickness of the polyimide film is preferably 1 μm or more. When the thickness is less than 1 μm, the polyimide film cannot retain sufficient mechanical strength, and when used as a flexible device substrate, it may not be able to withstand stress and may be destroyed. The thickness of the polyimide film is preferably 20 μm or less. If the thickness of the polyimide film exceeds 20 μm, it becomes difficult to reduce the thickness of the flexible device. The thickness of the polyimide film is more preferably 2 to 10 μm in order to make the film thinner while maintaining sufficient resistance as a flexible device.

The obtained polyimide film is firmly laminated on the glass substrate. The peel strength between the glass substrate and the polyimide film is generally 50 mN/mm or more, preferably 100 mN/mm or more, more preferably 200 mN/mm or more, even more preferably 300 mN/mm or more, when measured according to JIS K6854-1.

A flexible device substrate may be formed by forming/laminating a second layer such as a resin film or an inorganic film on the obtained polyimide film. In particular, an inorganic film is suitable because it is used as a water vapor barrier layer. Examples of the water vapor barrier layer include inorganic films containing an inorganic material selected from the group consisting of metal oxides, metal nitrides and metal oxynitrides such as silicon nitride ($SiN_x$), silicon oxide ($SiO_x$), silicon oxynitride ($SiO_xN_y$), aluminum oxide ($Al_2O_3$), titanium oxide ($TiO_2$), and zirconium oxide ($ZrO_2$). Generally, as methods of forming these thin films, physical vapor deposition methods such as vacuum vapor deposition method, sputtering method and ion plating method, and chemical vapor deposition methods such as plasma CVD method and catalytic chemical vapor deposition (Cat-CVD) method and the like are known. This second layer may also be multi-layered. Even in the case of the device having the second layer on the polyimide film, the influence of the polyimide film may reach the semiconductor layer through the second layer. Therefore, to improve the device characteristics and the durability, the polyimide having good C-V characteristics of the present invention is preferably used.

A flexible device substrate may be formed by laminating a polyimide film on a resin film or an inorganic film. A polyimide film may be laminated on a resin film or an inorganic film by using the polyimide precursor solution or the polyimide solution in the same manner as in the case of a carrier substrate.

The polyimide film obtained by the present invention is firmly laminated even when the inorganic film serves as a substrate. The peel strength between the polyimide film and the inorganic film (eg, silicon oxide film) is generally 20 mN/mm or more, preferably 30 mN/mm or more, and more preferably 40 mN/mm or more, yet more preferably 50 mN/mm or more, when measured according to JIS K6854-1.

In manufacturing an electronic devices, elements and circuits necessary for the device are formed on the obtained laminate (particularly, on the polyimide film). The elements and circuits to be formed and the manufacturing process thereof differ depending on the type of device. When manufacturing a TFT liquid crystal display device, a TFT of, for example, amorphous silicon is formed on a polyimide film. The TFT includes, for example, a gate metal layer, a semiconductor layer such as an amorphous silicon film, a silicon nitride gate dielectric layer, and an ITO pixel electrode. Further, a structure required for a liquid crystal display can be formed thereon by a known method. Since the polyimide film obtained in the present invention is excellent in various characteristics such as heat resistance and toughness, the method for forming a circuit or the like is not particularly limited.

When a flexible device is intended as an electronic device, a device substrate (particularly a polyimide film) having a circuit or the like formed on its surface is peeled from a carrier substrate. The peeling method is not particularly limited, and for example, laser peeling in which a carrier substrate side is irradiated with a laser or the like for peeling, mechanical peeling in which peeling is performed mechanically, or the like can be performed.

The polyimide and the polyimide film of the present invention (including those on which a second layer such as a resin film or an inorganic film is formed/laminated) are particularly suitable as a substrate of an electronic device which is desired to be thin and flexible. The term "flexible (electronic) device" as used herein means that the device itself is flexible, and a semiconductor layer (transistor, diode, etc. as an element) is usually formed on the substrate to complete the device. It does not mean, for example, a COF (Chip On Film) in which a "hard" semiconductor element such as an IC chip is mounted on a conventional FPC (flexible printed wiring board). Examples of flexible (electronic) devices to which the polyimide and polyimide film of the present invention described above and below are preferably used include display devices such as liquid crystal displays, organic EL displays and electronic paper, and light receiving devices such as solar cells and CMOS.

The polyimide of the present invention can be used in various applications, but in order to exert the effect of excellent C-V characteristics, it is preferably used in a device in which the polyimide and the semiconductor are in direct contact with each other or in a device in which they are laminated via a thin film (for example, a thin film of 200 nm or less, preferably 100 nm or less; for example, the above-mentioned second layers).

Further, in the above description, a method of forming an element or a circuit on the laminate of a polyimide film-carrier substrate has been described, but if there is no hindrance to the formation of the element or the circuit, elements and circuits may be formed on a single-layer polyimide film.

Examples of the semiconductor include silicon such as single crystal silicon, amorphous silicon, and polysilicon (which may be doped with an impurity for p-type or n-type), and gallium nitride-based compound semiconductors or other compound semiconductors.

EXAMPLE

Hereinafter, the present invention will be described in more detail with reference to examples. The present invention is not limited to the examples below.

The method of measuring the characteristics used in the following examples is shown below.

<C-V Characteristic Measurement Method>

The C-V characteristic was measured under the following conditions by the system shown in the schematically shown diagram of FIG. 1.

Measuring device: Mercury probe type C-V measuring device manufactured by Horiba Jobin Yvon (Mercury probe Model 802-150 (Materials Development Corporation)

Mercury electrode area: 0.00475 $cm^2$

Direct current voltage scanning condition: After holding at +40V for 30 s, negative scanning was performed from +40V to −40 V, and held at −40 V for 30 s, and then forward scanning was performed up to +40 V. This cycle was repeated 3 times. The scanning speed of the direct current voltage was 0.25 V/sec in Examples 1 to 7 and Comparative Examples 1 to 3, and 0.18 V/sec in Examples 8 to 16 and Comparative Examples 4 to 10. The reason of adopting 0.18 V/sec in the later Examples and Comparative Examples is due to the reduction of the measurement noise. However, there was no difference in the maximum gradient values compared with those measured at 0.25 V/sec (see Example 16 and Comparative Example 10)

AC-Voltage conditions: AC sine wave of frequency about 2.5 kHz, amplitude of 0.1V Measurement temperature: room temperature <Method of Determining Gradient>

As an approximate value of the differential function of the normalized C-V curve, absolute value "$|(C_{n2}-C_{n1})/(V_{n2}-V_{n1})|$" are calculated for the entire normalized C-V curve, wherein $C_{n1}$ is a normalized capacity at a certain voltage $V_{n1}$ and $C_{n2}$ is a normalized capacity at $V_{n2}$ which is $V_{n1}+1.5$ [V]. The maximum value of $|(C_{n2}-C_{n1})/(V_{n2}-V_{n1})|$ was determined as the gradient of the composition.

The monomers and additives used in Examples and Comparative Examples are shown below.

Monomer A: 3,3',4,4'-biphenyltetracarboxylic dianhydride (formula weight 294.22), purity (%) 99.9

Monomer A2: 3,3',4,4'-biphenyltetracarboxylic dianhydride (formula weight 294.22), purity (%) 99.0 (low purity)

Monomer B: (9H-fluorene-9,9-diyl)bis(2-methyl-4,1-phenylene)bis(1,3-dioxo-1,3-dihydroisobenzofuran-5-carboxylate) (formula weight 726.66), purity (%) 98.2

Monomer C: 1,4-diaminobenzene (formula weight 108.14), purity (%) 100.0

Monomer D: 4,4'-(((9H-fluorene-9,9-diyl)bis([1,1'-biphenyl]-5,2-diyl))bis(oxy))diamine (formula weight 684.78), purity (%) 99.0

Monomer E: [1,1':4',1"-terphenyl]-4,4"-diamine (formula weight 260.31), purity (%) 99.1

Monomer F: 4,4'-([1,1'-binaphthalene]-2,2'-diylbis(oxy))diamine (formula weight 468.51), Purity (%) 99.1

Monomer G: 1,4-bis[2-(4-aminophenyl)-2-propyl]benzene (formula weight 344.48), purity (%) 99.7, Monomer H: 9,9-bis(4-aminophenyl)fluorene (formula weight 348.43), purity (%) 99.2

Monomer I: phthalic anhydride (formula weight 148.11), purity (%) 100.0

Additive: 3-aminopropyltriethoxysilane (formula weight 218) 0.32), purity (%) 99.7

Monomer J: 5-(phenylethynyl)isobenzofuran-1,3-dione (formula weight 248.22), purity: 98.4%

Monomer K: 5-(3-oxo-3-phenylprop-1-yne-1-yl)isobenzofuran-1,3-dione (formula weight 276.23), purity: 99.8%

Monomer L: 5,5'-(ethyne-1,2-diyl)bis(isobenzofuran-1,3-dione) (formula weight 318.23), purity: 99.0%

Monomer M: 5,5'-(perfluoropropane-2,2-diyl)bis(isobenzofuran-1,3-dione) (formula weight 444.24), Purity: 99.1%

Monomer N: 5,5'-oxybis(isobenzofuran-1,3-dione) (formula weight 310.21), Purity: 99.73%

Monomer O: octahydro-3H,3"H-dispiro[[4,7]methanoisobenzofuran]-1,1"',3,3"',4'(4H,4"H)-pentaone (CpODA) (formula weight 384.37), Purity: 99.3%

Monomer P: cyclohexane-1,4-diamine (formula weight 114.19), Purity: 99.98%

Monomer Q: 4,4'-oxydianiline (formula weight 200.24), Purity: 99.98%

Monomer R: 1H,3H-benzo[1,2-c: 4,5-c:4,5c']difuran-1,3,5,7-tetraone (formula weight 218.12), Purity: 99.73%

The chemical structures of the monomers are shown below.

(monomer A)

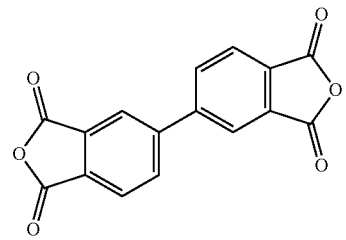

3,3′,4,4′-biphenyltetracarboxylic dianhydride (monomer B)

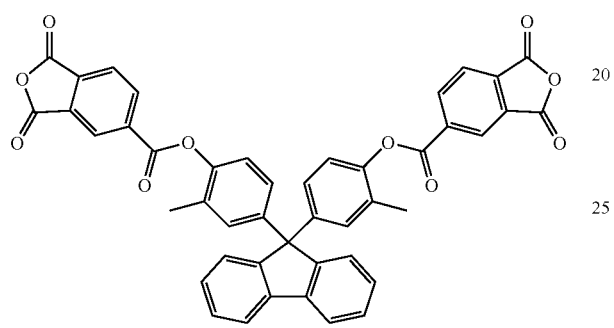

(9H-fluorene-9,9-diyl)bis(2-methyl-4,1-phenylene)bis(1,3-dihydroisobenzofuran-5-carboxylate)

(monomer I)

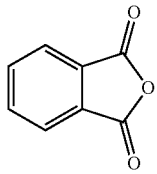

phthalic anhydride (monomer C)

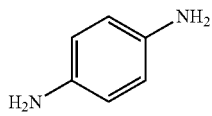

1,4-diaminobenzene (monomer D)

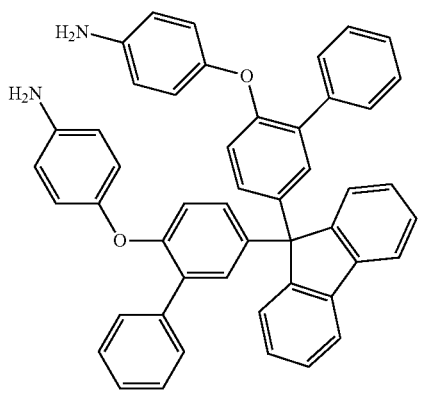

4,4′-(((9H-fluorene-9,9-diyl)bis([1,1′-biphenyl]-5,2-diyl))bis(oxy))diamine (monomer E)

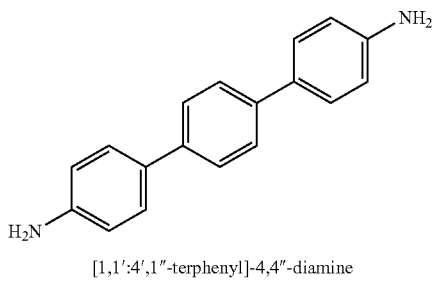

[1,1′:4′,1″-terphenyl]-4,4″-diamine (monomer F)

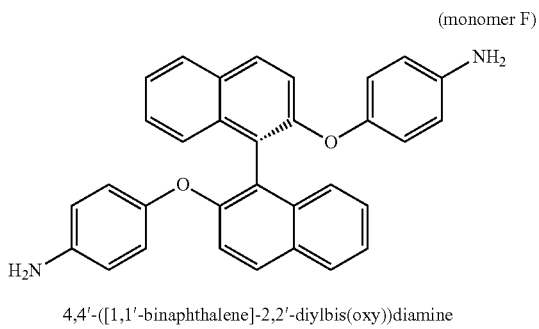

4,4′-([1,1′-binaphthalene]-2,2′-diylbis(oxy))diamine (monomer G)

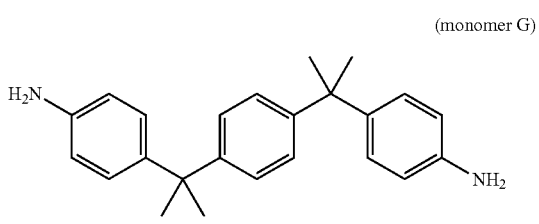

1,4-bis[2-(4-aminophenyl)-2-propyl]benzene (monomer H)

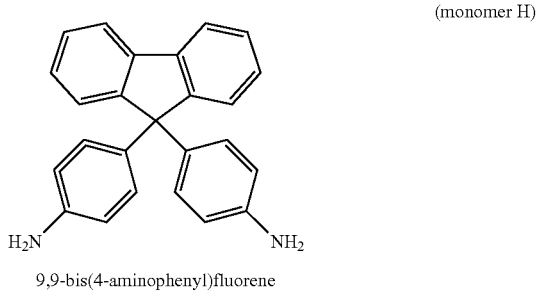

9,9-bis(4-aminophenyl)fluorene (monomer J)

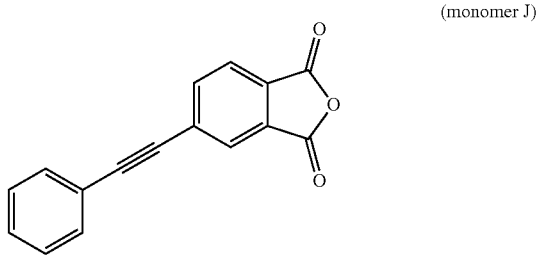

5-(phenylethynyl)isobenzofuran-1,3-dione (monomer K)

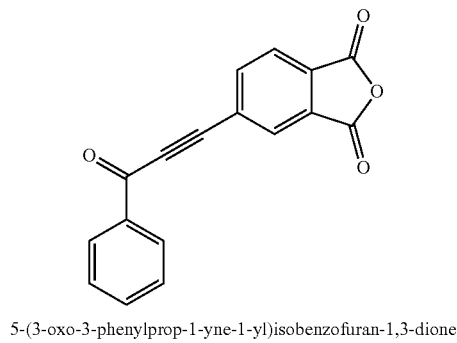

5-(3-oxo-3-phenylprop-1-yne-1-yl)isobenzofuran-1,3-dione (monomer L)

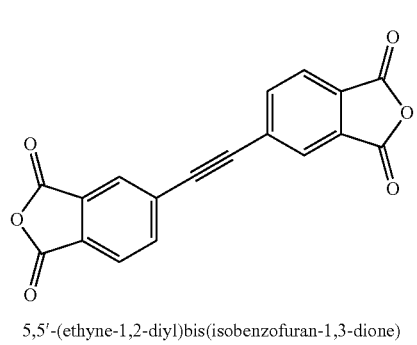

5,5'-(ethyne-1,2-diyl)bis(isobenzofuran-1,3-dione)

(monomer M)

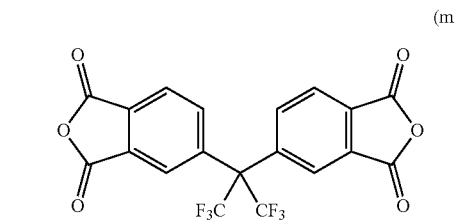

5,5'-(perfluoropropane-2,2-diyl)bis(isobenzofuran-1,3-dione)

(monomer N)

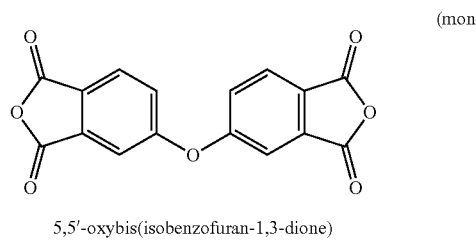

5,5'-oxybis(isobenzofuran-1,3-dione)

(monomer O: CpODA)

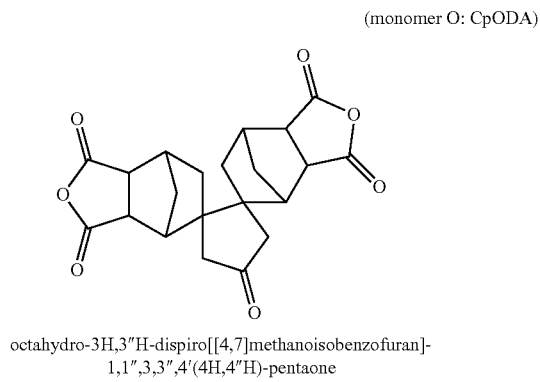

octahydro-3H,3″H-dispiro[[4,7]methanoisobenzofuran]-
1,1″,3,3″,4'(4H,4″H)-pentaone (monomer P)

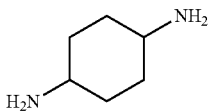

cyclohexane-1,4-diamine (monomer Q)

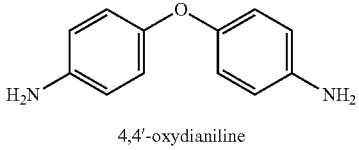

4,4'-oxydianiline (monomer R)

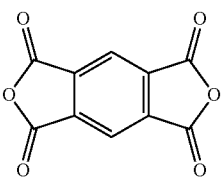

1H,3H-benzo[1,2-c:4,5-c']difuran-
1,3,5,7-tetraone

[Reference Example 1] (Composition of Example 1)

(Monomer A 50/Monomer B 50//Monomer C 50/Monomer D 50)

1,4-diaminobenzene (50 mol %) and 4,4'-(((9H-fluorene-9,9-diyl)bis([1,1'-biphenyl]-5,2-diyl))bis(oxy)) diamine (50 mol %), and NMP were charged into a reaction vessel purged with nitrogen gas and heated and stirred at 40° C. for 15 minutes to dissolve the monomer. Then, 3,3',4,4'-biphenyltetracarboxylic dianhydride (50 mol %) and (9H-fluorene-9,9-diyl)bis(2-methyl-4,1-phenylene)bis(1,3-dioxo-1,3-dihydroisobenzofuran-5-carboxylate) (50 mol %) were added, and the mixture was stirred for another 30 minutes, to obtain a liquid polyimide precursor resin composition (polyamic acid solution) having a viscosity of 1.82 Pa·s (25° C.).

[Reference Example 2] (Composition of Example 2)

(Monomer A 50/Monomer B 50//Monomer D 50/Monomer E 50)

[1,1':4',1″-terphenyl]-4,4″-diamine and 4,4'-(((9H-fluorene-9,9-diyl)bis([1,1'-biphenyl]-5,2-diyl))bis(oxy))diamine, and NMP were charged into a reaction vessel purged with nitrogen gas and heated and stirred at 40° C. for 15 minutes to dissolve the monomer. Then, 3,3',4,4'-biphenyltetracarboxylic dianhydride (50 mol %) and (9H-fluorene-9,9-diyl)bis(2-methyl-4,1-phenylene)bis(1,3-dioxo-1,3-dihydroisobenzofuran-5-carboxylate) (50 mol %) were added, and the mixture was stirred for another 30 minutes, to obtain a liquid polyimide precursor resin composition (polyamic acid solution) having a viscosity of 0.742 Pa·s (25° C.).

[Reference Example 3] (Composition of Example 3)

(Monomer A 50/Monomer B 50//Monomer E 50/Monomer F 50)

[1,1':4',1''-terphenyl]-4,4''-diamine and 4,4'-([1,1'-binaphthalene]-2,2'-diylbis(oxy))diamine, and NMP were charged into a reaction vessel purged with nitrogen gas and heated and stirred at 40° C. for 15 minutes to dissolve the monomer. Then, 3,3',4,4'-biphenyltetracarboxylic dianhydride (50 mol %) and (9H-fluorene-9,9-diyl)bis(2-methyl-4,1-phenylene) bis(1,3-dioxo-1,3-dihydroisobenzofuran-5-carboxylate) (50 mol %) were added, and the mixture was stirred for another 30 minutes, to obtain a liquid polyimide precursor resin composition (polyamic acid solution) having a viscosity of 0.886 Pa·s (25° C.).

[Reference Example 4] (Composition of Example 4)

(Monomer A 100//Monomer G 50/Monomer H 50)

1,4-bis[2-(4-aminophenyl)-2-propyl]benzene and 9,9-bis(4-aminophenyl)fluorine, and NMP were charged into a reaction vessel purged with nitrogen gas and heated and stirred at 40° C. for 15 minutes to dissolve the monomer. Then, 3,3',4,4'-biphenyltetracarboxylic dianhydride (100 mol %) was added, and the mixture was stirred for another 30 minutes, to obtain a liquid polyimide precursor resin composition (polyamic acid solution) having a viscosity of 3.249 Pa·s (25° C.).

[Reference Example 5] (Composition of Example 5)

(Monomer A 100//Monomer G 50/Monomer H 50)

1,4-bis[2-(4-aminophenyl)-2-propyl]benzene and 9,9-bis(4-aminophenyl)fluorine, and NMP were charged into a reaction vessel purged with nitrogen gas and heated and stirred at 40° C. for 15 minutes to dissolve the monomer. Then, 3,3',4,4'-biphenyltetracarboxylic dianhydride (100 mol %) was added, and the mixture was stirred for another 30 minutes, to obtain a polyamic acid solution. Then, the temperature was raised to 190° C. and held for 3 hours for imidization to obtain a liquid polyimide resin composition (polyimide solution) having a viscosity of 4.03 Pa·s (25° C.).

[Reference Example 6] (Composition of Example 6)

(Monomer A 100//Monomer C 100)

1,4-diaminobenzene (100 mol %) and NMP were charged into a reaction vessel purged with nitrogen gas and heated and stirred at 40° C. for 15 minutes to dissolve the monomer. Then, 3,3',4,4'-biphenyltetracarboxylic dianhydride (100 mol %) was added, and the mixture was stirred for another 30 minutes, to obtain a liquid polyimide precursor resin composition (polyamic acid solution) having a viscosity of 6.6 Pa's (25° C.).

[Reference Example 7] (Composition of Example 7)

(Monomer A 98//Monomer C 100//Monomer I 4)

1,4-diaminobenzene (100 mol %) and NMP were charged into a reaction vessel purged with nitrogen gas and heated and stirred at 40° C. for 15 minutes to dissolve the monomer. Then, 3,3',4,4'-biphenyltetracarboxylic dianhydride (98 mol %) was added, and the mixture was stirred for another 30 minutes. Thereafter, phthalic anhydride (4 mol %) was added and further stirred for 30 minutes to obtain a liquid polyimide precursor resin composition (polyamic acid solution) having a viscosity of 3.11 Pa·s (25° C.).

[Reference Example 8] (Composition of Comparative Example 1)

(Monomer A 99.5//Monomer C 100//Additive)

1,4-diaminobenzene (100 mol %) and NMP were charged into a reaction vessel purged with nitrogen gas and heated and stirred at 40° C. for 15 minutes to dissolve the monomer. Then, 3,3',4,4'-biphenyltetracarboxylic dianhydride (99.5 mol %) and 3-aminopropyltriethoxysilane (0.05 parts with respect to the total amount of the monomers) were added, and the mixture was stirred for another 30 minutes, to obtain a liquid polyimide precursor resin composition (polyamic acid solution) having a viscosity of 28.75 Pa·s (25° C.).

[Reference Example 9] (Composition of Comparative Example 2)

(Monomer A 98//Monomer C 100)

1,4-diaminobenzene (100 mol %) and NMP were charged into a reaction vessel purged with nitrogen gas and heated and stirred at 40° C. for 15 minutes to dissolve the monomer. Then, 3,3',4,4'-biphenyltetracarboxylic dianhydride (98 mol %) was added, and the mixture was stirred for another 30 minutes, to obtain a liquid polyimide precursor resin composition (polyamic acid solution) having a viscosity of 3.11 Pa·s (25° C.).

[Reference Example 10] (Composition of Comparative Example 3)

(Monomer A2 100//Monomer C 100)

1,4-diaminobenzene (100 mol %) and NMP were charged into a reaction vessel purged with nitrogen gas and heated and stirred at 40° C. for 15 minutes to dissolve the monomer. Then, 3,3',4,4'-biphenyltetracarboxylic dianhydride (monomer A2; low purity) (100 mol %) was added, and the mixture was stirred for another 30 minutes, to obtain a liquid polyimide precursor resin composition (polyamic acid solution) having a viscosity of 480 Pa·s (25° C.).

Examples 1 to 3

A solution obtained by further diluting the polyamic acid solution produced in Reference Examples 1 to 3 was spin-coated on 6-inch silicon wafer (625 μm thick, resistivity 4 Ωcm, p-type (impurity boron)). Heat treatment was performed at 120° C., 150° C., 200° C., and 250° C. for 10 minutes each and at 330° C. for 5 minutes to form a polyimide film having a thickness of 0.75 μm. Table 1 shows the results of C-V measurement using the obtained polyimide film and the composition of the reference example used.

Example 4

Similar to Example 1, a solution obtained by further diluting the polyamic acid solution prepared in Reference Example 4 was spin-coated on a 6-inch silicon wafer. Heat treatment was performed at 120° C., 150° C., 200° C., and 250° C. for 10 minutes each and at 360° C. for 5 minutes to form a polyimide film having a thickness of 0.75 μm. The results are shown in Table 1.

Example 5

Similar to Example 1, a solution obtained by further diluting the polyimide solution prepared in Reference Example 5 was spin-coated on a δ-inch silicon wafer. Heat treatment was performed at 120° C., 150° C., 200° C., and 250° C. for 10 minutes each and at 300° C. for 5 minutes to form a polyimide film having a thickness of 0.75 μm. The results are shown in Table 1.

Examples 6 and 7, Comparative Examples 1, 2 and 3

Similar to Example 1, a solution obtained by further diluting the polyimide solution prepared in Reference Examples 6, 7, 8, 9, and 10 was spin-coated on a 6-inch silicon wafer. Heat treatment was performed at 120° C., 150° C. 200° C. and 250° C. for 10 minutes each and at 450° C. for 5 minutes to forma polyimide film having a thickness of 0.75 μm. The results are shown in Table 1.

Viscosity of the obtained liquid polyimide precursor resin composition (polyamic acid solution): 1.160 Pa·s (25° C.)

[Reference Example 12] (Composition of Example 9)

(Monomer A 70/Monomer N 30//Monomer C 100)

Tetracarboxylic acid dianhydride: 3,3',4,4'-biphenyltetra-carboxylic dianhydride (monomer A) (70 mol %)+5,5'-oxybis (isobenzofuran-1,3-dione) (monomer N) (30 mol %)

Diamine component: 1,4-diaminobenzene (100 mol %)

Viscosity of liquid polyimide precursor resin composition (polyamic acid solution): 1.250 Pa·s (25° C.)

TABLE 1

|  | Example 1 | Example 2 | Example 3 | Example 4 | Example 5 | Example 6 | Example 7 | Comp-Example 1 | Comp-Example 2 | Comp-Example 3 |
|---|---|---|---|---|---|---|---|---|---|---|
| tetracarboxylic acid component | A 50 /B 50 | A 50 /B 50 | A 50 /B 50 | A 100 | A 100 | A 100 | A 98 | A 100 | A 93 | A2 100 |
| diamine component | C 50/D 50 | D 50/B 50 | E 50/F 50 | G 50/H 50 | G 50/H 50 | C 100 | C 100 | C 100 | C 100 | C 100 |
| end capping agent, or additive | none | none | none | none | none | none | mono-maer 14 | 3-aminopropyl-triethoxysilane | none | none |
| formula weight of repeating unit of poyimide | 870.86 | 946.945 | 838.81 | 604.635 | 604.635 | 366.32 | 366.32 | 366.32 | 366.32 | 366.32 |
| weight ratio of imide group [wt %] | 16.1 | 14.8 | 16.7 | 23.2 | 23.2 | 38.2 | 38.2 | 38.2 | 38.2 | 38.2 |
| weight ratio of (imide group) + (functional group in repeating unit) [wt %] | 23.0 | 21.1 | 23.9 | 23.2 | 23.2 | 38.2 | 38.2 | 38.2 | 38.2 | 38.2 |
| amount of terminal amine group [μ mol/g] | 10.4 | 0 | 1.2 | 0 | 0 | 5.5 | 5.5 | 35.4 | 116.6 | 55.1 |
| amount of terminal acid dianhydride group [μ mol/g] | 0 | 0 | 0 | 14.9 | 14.9 | 0 | 0 | 0 | 0 | 0 |
| amount of terminal functional group [μ mol/g] | 10.4 | 0.0 | 1.2 | 14.9 | 14.9 | 5.5 | 5.5 | 35.4 | 116.6 | 55.1 |
| C-V characteristics maximum gradient [$V^{-1}$] | 0.0116 | 0.0014 | 0.0104 | 0.0054 | 0.0104 | 0.001 | 0.0052 | 0.0040 | 0.0040 | 0.0049 |

In Reference Examples 11 to 26 below, similar to Reference Example 1 and the like, diamine compound(s) and NMP were charged in a reaction vessel purged with nitrogen gas, and heated and stirred at 40° C. for 15 minutes to dissolve the monomer. Then, tetracarboxylic dianhydride(s) was added and stirred for 30 minutes to obtain a liquid polyimide precursor resin composition (polyamic acid solution). In the case of adding the end capping agent (Reference Examples 16 to 18), as in Reference Example 7, the end capping agent was added thereafter, and the mixture was further stirred for 30 minutes to obtain a liquid polyimide precursor resin composition (polyamic acid solution).

[Reference Example 11] (Composition of Example 8)

(Monomer A 70/Monomer M 30//Monomer C 100)

Tetracarboxylic acid dianhydride: 3,3',4,4'-biphenyltetra-carboxylic dianhydride (monomer A) (70 mol %)+5,5'-(perfluoropropane-2,2-diyl)bis(isobenzofuran-1,3-dione) (monomer M) (30 mol %)

Diamine component: 1, 4-diaminobenzene (100 mol %)

[Reference Example 13] (Composition of Example 10)

(Monomer A 70/Monomer O 30///Monomer C 100)

Tetracarboxylic acid dianhydride: 3,3',4,4'-biphenyltetra-carboxylic dianhydride (monomer A) (70 mol %)+CpODA (monomer O) (30 mol %)

Diamine component: 1,4-diaminobenzene (100 mol %)

Viscosity of the obtained liquid polyimide precursor resin composition (polyamic acid solution): 1.303 Pa·s (25° C.)

[Reference Example 14] (Composition of Example 11)

(Monomer A 100//Monomer C 70/Monomer P 30)

Tetracarboxylic acid dianhydride: 3,3',4,4'-biphenyltetra-carboxylic dianhydride (monomer A) (100 mol %)

Diamine component: 1,4-diaminobenzene (70 mol %)+cyclohexane-1,4-diamine (monomer P) (30 mol %)

Viscosity of the obtained liquid polyimide precursor resin composition (polyamic acid solution): 1.811 Pa·s (25° C.)

[Reference Example 15] (Composition of Example 12)

(Monomer A 100//Monomer C 70/Monomer Q 30)
Tetracarboxylic acid dianhydride: 3,3',4,4'-biphenyltetracarboxylic dianhydride (monomer A) (100 mol %)
Diamine component: 1,4-diaminobenzene (70 mol %)+4,4'-oxydianiline (monomer Q) (30 mol %)
Viscosity of the obtained liquid polyimide precursor resin composition (polyamic acid solution): 1.562 Pa·s (25° C.)

[Reference Example 16] (Composition of Example 13)

(Monomer A 98//Monomer C 100//Monomer J 4)
Tetracarboxylic acid dianhydride: 3,3',4,4'-biphenyltetracarboxylic dianhydride (monomer A) (98 mol %)
Diamine component: 1,4-diaminobenzene (100 mol %)
End capping agent: 5-(phenylethynyl)isobenzofuran-1,3-dione (monomer J) (4 mol %)
Viscosity of the obtained liquid polyimide precursor resin composition (polyamic acid solution): 3.11 Pa·s (25° C.)

[Reference Example 17] (Composition of Example 14)

(Monomer A 98//Monomer C 100//Monomer K 4)
Tetracarboxylic acid dianhydride: 3,3',4,4'-biphenyltetracarboxylic dianhydride (monomer A) (98 mol %)
Diamine component: 1,4-diaminobenzene (100 mol %)
End capping agent: 5-(3-oxo-3-phenylprop-1-yn-1-yl)isobenzofuran-1,3-dione (monomer K) (4 mol %)
Viscosity of the obtained liquid polyimide precursor resin composition (polyamic acid solution): 3.11 Pa·s (25° C.)

[Reference Example 18] (Composition of Example 15)

(Monomer A 98//Monomer C 100//Monomer L 2)
Tetracarboxylic acid dianhydride: 3,3',4,4'-biphenyltetracarboxylic dianhydride (monomer A) (98 mol %)
Diamine component: 1,4-diaminobenzene (100 mol %)
End capping agent: 5,5'-(ethyne-1,2-diyl)bis(isobenzofuran-1,3-dione) (monomer L) (2 mol %) (Note: monomer L is a tetracarboxylic acid dianhydride, but was added last, similar to the end capping agents.)
Viscosity of the obtained liquid polyimide precursor resin composition (polyamic acid solution): 3.11 Pa·s (25° C.)

[Reference Example 19] (Composition of Comparative Example 4)

(Monomer A 30/Monomer R 70//Monomer C 100)
Tetracarboxylic acid dianhydride: 3,3',4,4'-biphenyltetracarboxylic dianhydride (monomer A) (30 mol %)+1H,3H-benzo[1,2-c: 4,5-c:4,5c']difuran-1,3,5,7-tetraone (monomer R) (70 mol %)
Diamine component: 1,4-diaminobenzene (100 mol %)
Viscosity of the obtained liquid polyimide precursor resin composition (polyamic acid solution): 1.23 Pa·s (25° C.)

[Reference Example 20] (composition of Comparative Example 5)

(Monomer A 68.6/Monomer M 29.4//Monomer C 100)
Tetracarboxylic acid dianhydride: 3,3',4,4'-biphenyltetracarboxylic dianhydride (monomer A) (68.6 mol %)+5,5'-(perfluoropropane-2,2-diyl)bis(isobenzofuran-1,3-dione) (monomer M) (29.4 Mol %)
Diamine component: 1,4-diaminobenzene (100 mol %)
Viscosity of the obtained liquid polyimide precursor resin composition (polyamic acid solution): 0.130 Pa·s (25° C.)

[Reference Example 21] (Composition of Comparative Example 6)

(Monomer A 68.6/Monomer N 29.4//Monomer C 100)
Tetracarboxylic acid dianhydride: 3,3',4,4'-biphenyltetracarboxylic dianhydride (monomer A) (68.6 mol %)+5,5'-oxybis(isobenzofuran-1,3-dione) (monomer N) (29.4 mol %)
Diamine component: 1,4-diamino Benzene (100 mol %)
Viscosity of the obtained liquid polyimide precursor resin composition (polyamic acid solution): 0.144 Pa·s (25° C.)

[Reference Example 22] (Composition of Comparative Example 7)

(Monomer A 68.6/Monomer O 29.4//Monomer C 100)
Tetracarboxylic acid dianhydride: 3,3',4,4'-biphenyltetracarboxylic dianhydride (monomer A) (68.6 mol %)+CpODA (monomer O) (29.4 mol %)
Diamine component: 1,4-diaminobenzene (100 mol %)
Viscosity of the obtained liquid polyimide precursor resin composition (polyamic acid solution): 0.102 Pa·s (25° C.)

[Reference Example 23] (Composition of Comparative Example 8)

(Monomer A 98//Monomer C 70/Monomer P 30)
Tetracarboxylic acid dianhydride: 3,3',4,4'-biphenyltetracarboxylic dianhydride (Monomer A) (98 mol %)
Diamine component: 1,4-diaminobenzene (70 mol %)+cyclohexane-1,4-diamine (monomer P) (30 mol %)
Viscosity of the obtained liquid polyimide precursor resin composition (polyamic acid solution): 0.281 Pa·s (25° C.)

[Reference Example 24] (Composition of Comparative Example 9)

(Monomer A 98//Monomer C 70/Monomer Q 30)
Tetracarboxylic acid dianhydride: 3,3',4,4'-biphenyltetracarboxylic dianhydride (Monomer A) (98 mol %)
Diamine component: 1,4-diaminobenzene (70 mol %)+4,4'-oxydianiline (monomer Q) (30 mol %)
Viscosity of the obtained liquid polyimide precursor resin composition (polyamic acid solution): 0.062 Pa·s (25° C.)

Examples 8 to 15, Comparative Examples 5 to 9

Using the polyamic acid solutions prepared in Reference Examples 11 to 18 and Reference Examples 20 to 24, polyimide films were formed in the same conditions as in Example 4. Namely, a solution obtained by further diluting the polyamic acid solution prepared in Reference Examples was spin-coated on a 6-inch silicon wafer. Heat treatment was performed at 120° C., 150° C., 200° C., and 250° C. for 10 minutes each and at 360° C. for 5 minutes to form a polyimide film having a thickness of 0.75 μm. The results are shown in Table 2.

Comparative Example 4

Using the polyamic acid solution prepared in Reference Example 19, a polyimide film was formed in the same conditions as in Example 6. Namely, a solution obtained by further diluting the polyamic acid solution prepared in Reference Example was spin-coated on a 6-inch silicon wafer. Heat treatment was performed at 120° C., 150° C., 200° C., and 250° C. for 10 minutes each and at 450° C. for 5 minutes to form a polyimide film having a thickness of 0.75 μm. The results are shown in Table 2.

Example 16 and Comparative Example 10

In Example 16 and Comparative Example 10, the same samples as in Example 6 and Comparative Example 1 were prepared, respectively, so that the influence of the scanning speed of the direct current voltage during the measurement of the C-V characteristics was confirmed. The maximum gradients of Example 16 and Comparative Example 10, in which the scanning speed of the direct current voltage during the measurement of the C-V characteristics was changed to 0.18 V/sec, were 0.007/V and 0.004/V, respectively. The results were consistent with those of Example 6 and Comparative Example 1 measured at a scanning speed of 0.25 V/sec.

TABLE 2

|  | Example 8 | Example 9 | Example 10 | Example 11 | Example 12 | Example 13 | Example 14 | Example 15 |
|---|---|---|---|---|---|---|---|---|
| tetracarboxylic acid component | A 70/M 30 | A 70/N 30 | A 70/O 30 | A 100 | A 100 | A 98 | A 98 | A 98 |
| diamine component | C 100 | C 100 | C 100 | C 70/P 30 | C 70/Q 30 | C 100 | C 100 | C 100 |
| end capping agent, or additive | none | none | none | none | none | monomer J4 | monomer K4 | monomer L2 |
| formula weight of repeating unit of peyimide | 411.326 | 371.117 | 393.365 | 368.135 | 393.95 | 366.32 | 366.32 | 366.32 |
| weight ratio of imide group [wt %] | 34 | 37.7 | 35.5 | 38.2 | 35.5 | 38.2 | 38.2 | 38.2 |
| weight ratio of (imide group) + (functional group in repeating unit) [wt %] | 44.1 | 39.0 | 37.7 | 40.3 | 36.8 | 38.2 | 38.2 | 38.2 |
| amount of terminal amine group [μ mol/g] | 16.6 | 8.1 | 14.3 | 5.1 | 4.3 | 7.0 | 5.5 | 6.4 |
| amount ot terminal acid dianhydride group [μ mol/g] | 0 | 0 | 0 | 0 | 0 | 0 | 0 | 0 |
| amount of terminal functional group [μ mol/g] | 16.6 | 8.1 | 14.3 | 5.1 | 4.8 | 7.0 | 5.5 | 6.4 |
| C-V characteristics maximum gradient [$V^{-1}$] | 0.0103 | 0.00628 | 0.0056 | 0.0062 | 0.0062 | 0.0053 | 0.0054 | 0.0063 |

|  | Comp-Example 4 | Comp-Example 5 | Comp-Example 6 | Comp-Example 7 | Comp-Example 8 | Comp-Example 9 |
|---|---|---|---|---|---|---|
| tetracarboxylic acid component | A 30/R 70 | A 68.6/M 29.4 | A 68.6/N 29.4 | A 68.6/O 29.4 | A 98 | A 98 |
| diamine component | C 100 | C 100 | C 100 | C 100 | C 70 /P 30 | C 70 /Q 30 |
| end capping agent, or additive | none | none | none | none | none | none |
| formula weight of repeating unit of peyimide | 313.05 | 471.326 | 371.117 | 393.365 | 368.135 | 393.95 |
| weight ratio of imide group [wt %] | 44.7 | 34 | 37.7 | 35.6 | 38 | 35.5 |
| weight ratio of (imide group) + (functional group in repeating unit) [wt %] | 44.7 | 44.1 | 39.0 | 37.7 | 38.0 | 36.8 |
| amount of terminal amine group [μ mol/g] | 14 | 115.5 | 117.5 | 117.6 | 115.4 | 107.7 |
| amount ot terminal acid dianhydride group [μ mol/g] | 0 | 0 | 0 | 0 | 0 | 0 |
| amount of terminal functional group [μ mol/g] | 14 | 115.5 | 117.5 | 117.6 | 115.4 | 107.7 |
| C-V characteristics maximum gradient [$V^{-1}$] | 0.0033 | 0.004 | 0.004 | 0.0048 | 0.0033 | 0.0047 |

INDUSTRIAL APPLICABILITY

The polyimide of the present invention is suitably used in electronic device applications such as flexible device substrates.

EXPLANATION OF REFERENCE

1 Silicon wafer
2 Polyimide film
3 Mercury electrode
4 DC power supply
5 AC power supply

The invention claimed is:

1. A polyimide film-based flexible electronic device substrate formed from a polyimide that does not comprise a compound including a Si-containing group, wherein the polyimide has a maximum gradient of 0.005/V or more in a capacitance-voltage measurement of a laminate in which a polyimide film having a film thickness of 0.75 μm is formed on a silicon wafer having a resistance value of 4 Ωcm; wherein the maximum gradient is a maximum value of an absolute value of a gradient in a normalized capacity-voltage curve during a third scan of forward direction scans; wherein a capacity-voltage curve is measured by applying a direct current voltage to the polyimide film with respect to the silicon wafer between a lowest voltage V1 and a highest voltage V2, and measuring capacitance while the direct current voltage is scanned in a forward direction from the lowest voltage V1 to the highest voltage V2 and scanned in a negative direction from the highest voltage V2 to the lowest voltage V1; where the lowest voltage V1 is a voltage at which the capacity of only the polyimide film is observed, and the normalized capacity-voltage curve is normalized so that the capacity at the lowest voltage V1 is 1.

2. The polyimide film-based flexible electronic device substrate according to claim 1, wherein a weight ratio of an imide group (—CONCO—) in a repeating unit of the polyimide is less than 38.3 wt %.

3. The polyimide film-based flexible electronic device substrate according to claim 1, wherein the concentration of amine end groups calculated from a feed ratio in the entire polyimide is 29 μmol/g or less.

4. A polyimide precursor comprising a repeating unit which is obtainable by reacting:

a tetracarboxylic acid component (A) comprising at least 3,3', 4,4'-biphenyltetracarboxylic dianhydride, and
a diamine component (B) comprising:
(B-1) at least one diamine selected from the group consisting of 1,4-diaminobenzene, [1.1': 4',1''-terphenyl]-4,4''-diamine, and 1,4-bis [2-(4-aminophenyl)-2-propyl]benzene, and
(B-2) at least one diamine selected from the group consisting of 9,9-bis (4-aminophenyl) fluorene, 4,4'-(49H-fluorene-9,9-diyl)bis([1,1'-biphenyl]-5,2-diyl))bis(oxy))diamine, and 4,4'-([1,1'-binaphthalene]-2,2'-diylbis(oxy))diamine,
with the proviso that when the diamine component (B) comprises 1,4-diaminobenzene and 9,9-bis(4-aminophenyl)fluorene), the amount of diamine compound(s) other than the diamine of (B-1) and the diamine (B-2) is 20 mol % or less, with the proviso that the repeating unit does not include a Si-containing group.

5. The polyimide precursor according to claim 4, wherein the diamine component (B) comprises the diamine of (B-1) and the diamine of (B-2) in an amount of 40 mol % or more in total.

6. The polyimide precursor according to claim 4, wherein a sum of ratios of the repeating units derived from 3,3', 4,4'-biphenyltetracarboxylic dianhydride and the diamine (B-1) and the repeating units derived from 3,3', 4,4'-biphenyltetracarboxylic dianhydride and the diamine (B-2) is 40 mol % or more.

7. A polyimide obtained by imidizing the polyimide precursor according to claim 4.

8. A polyimide film comprising the polyimide according to claim 7.

9. A flexible electronic device comprising the polyimide film according to claim 1.

10. The flexible electronic device according to claim 9, wherein the substrate is formed from the polyimide film according to claim 8.

11. A method for manufacturing a flexible electronic device according to claim 9, comprising:
applying a polyimide precursor solution or a polyimide precursor solution composition onto a carrier substrate, and performing imidization to form a laminate having a carrier substrate and a polyimide film that becomes the substrate.

* * * * *

UNITED STATES PATENT AND TRADEMARK OFFICE
CERTIFICATE OF CORRECTION

| | | |
|---|---|---|
| PATENT NO. | : 11,898,009 B2 | Page 1 of 1 |
| APPLICATION NO. | : 17/048431 | |
| DATED | : February 13, 2024 | |
| INVENTOR(S) | : Norio Miura and Kazutaka Narita | |

It is certified that error appears in the above-identified patent and that said Letters Patent is hereby corrected as shown below:

In the Specification

Column 1, Line 36, delete "Reliebility" and insert -- Reliability --.

Column 2, Line 30, delete "V1:" and insert -- V1; --.

Column 8, Line 58-59 (approx.), delete "hexafluoroisoproylidene" and insert -- hexafluoroisopropylidene --.

Column 9, Line 36, delete "tetraarboxylic" and insert -- tetracarboxylic --.

Column 27, Line 30 (approx.), delete "3-" and insert -- 3-dioxo-1,3- --.

Column 33, Line 15 (approx.), delete "forma" and insert -- form a --.

Column 33, Line 30 (approx.), delete "poyimide" and insert -- polyimide --.

Column 37, Line 35 (approx.), delete "ot" and insert -- of --.

In the Claims

Column 40, Line 10, Claim 4, delete "(49H-" and insert -- -(((9H- --.

Signed and Sealed this
Twenty-seventh Day of August, 2024

Katherine Kelly Vidal
*Director of the United States Patent and Trademark Office*